(12) United States Patent
Kusaka

(10) Patent No.: US 11,392,027 B2
(45) Date of Patent: Jul. 19, 2022

(54) IMPRINT APPARATUS, IMPRINT METHOD, AND METHOD FOR MANUFACTURING ARTICLE

(71) Applicant: CANON KABUSHIKI KAISHA, Tokyo (JP)

(72) Inventor: Atsushi Kusaka, Shimotsuke (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/860,487

(22) Filed: Apr. 28, 2020

(65) Prior Publication Data

US 2020/0379343 A1 Dec. 3, 2020

(30) Foreign Application Priority Data

May 28, 2019 (JP) .............................. JP2019-099739

(51) Int. Cl.
*G03F 7/00* (2006.01)
*B29C 33/42* (2006.01)

(52) U.S. Cl.
CPC .......... *G03F 7/0002* (2013.01); *B29C 33/424* (2013.01); *B29C 2033/426* (2013.01)

(58) Field of Classification Search
CPC ........................ B29C 33/424; B29C 2033/426; G03F 7/0002
See application file for complete search history.

(56) References Cited

U.S. PATENT DOCUMENTS

| | | | |
|---|---|---|---|
| 9,594,301 B2 | 3/2017 | Hayashi | |
| 10,444,624 B1* | 10/2019 | Lu ........................ | G03F 7/0002 |
| 2007/0132157 A1* | 6/2007 | Tokita ................... | G03F 7/0002 264/494 |
| 2013/0037981 A1* | 2/2013 | Tanaka .................. | B82Y 40/00 264/40.5 |
| 2014/0339734 A1* | 11/2014 | Murakami .......... | B29C 35/0288 264/293 |
| 2014/0346700 A1* | 11/2014 | Sato ...................... | G03F 9/7042 425/169 |
| 2015/0013559 A1* | 1/2015 | Hayashi ................ | G03F 9/7088 101/450.1 |

(Continued)

FOREIGN PATENT DOCUMENTS

| | | |
|---|---|---|
| JP | 2013102132 A | 5/2013 |
| JP | 2017022242 A | 1/2017 |
| JP | 2017079242 A | 4/2017 |

*Primary Examiner* — Leith S Shafi
(74) *Attorney, Agent, or Firm* — Rossi, Kimms & McDowell LLP

(57) ABSTRACT

Provided is an imprint apparatus which reduces a shift of a mold from a desired position. The imprint apparatus that forms a pattern of an imprint material on a substrate using a mold includes a correction mechanism which corrects a shape and a magnification of the mold, and a control unit which controls the correction mechanism on the basis of a difference in shape and magnification between the mold and the substrate. The control unit changes a shape coefficient multiplied by a correction amount of the shape to balance a resultant force and a moment on the mold applied by the correction mechanism on the basis of a magnification coefficient, which is a coefficient multiplied by a correction amount of the magnification through closed-loop control.

15 Claims, 17 Drawing Sheets

(56) References Cited

U.S. PATENT DOCUMENTS

| | | | | |
|---|---|---|---|---|
| 2015/0325526 A1* | 11/2015 | Hayashi | ................ | G03F 9/7088 |
| | | | | 264/40.5 |
| 2016/0144553 A1* | 5/2016 | Kobayashi | ........... | G05B 19/182 |
| | | | | 425/150 |
| 2016/0223919 A1* | 8/2016 | Nakagawa | ............ | G03F 7/0002 |
| 2017/0050351 A1* | 2/2017 | Mizuta | .................... | B29C 43/58 |

* cited by examiner

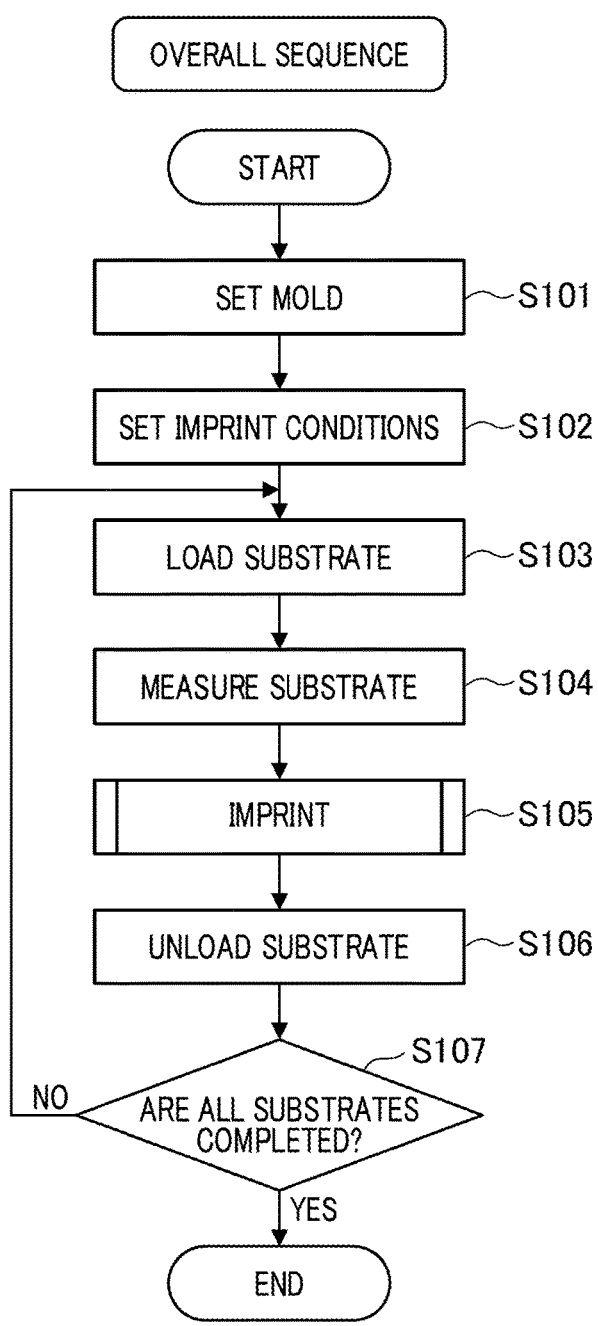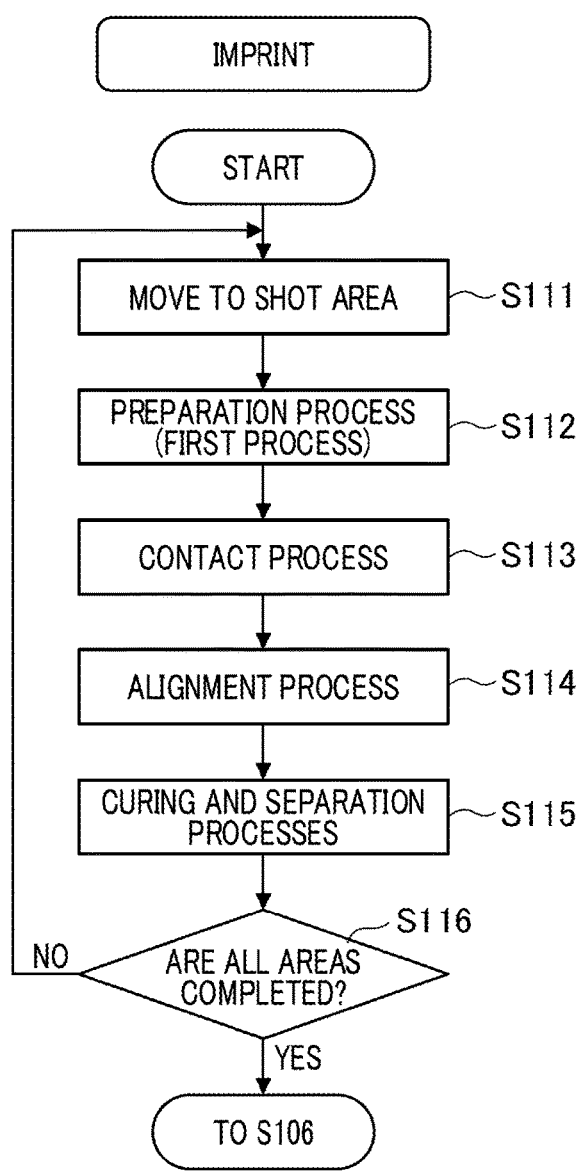

IMPRINT APPARATUS, IMPRINT METHOD, AND METHOD FOR MANUFACTURING ARTICLE

BACKGROUND OF THE INVENTION

Field of the Invention

The present invention relates to an imprint apparatus, an imprint method, and a method for manufacturing an article.

Description of the Related Art

An imprint technique is a technique that enables transfer of a nanoscale fine pattern, and has been proposed as one of lithography techniques for mass production of semiconductor devices and magnetic storage media. An imprint apparatus using an imprint technique cures a curable composition (an imprint material) in a state in which a mold on which a pattern is formed and the composition on a substrate are brought into contact with each other and separates the mold from the cured composition, thereby forming the pattern on the substrate. In an imprint apparatus, a photo-curing method of curing a composition on a substrate by radiating light such as ultraviolet rays is used for a resin curing method.

In an imprint apparatus, in order to maintain performance of the apparatus, it is required to transfer a pattern of a mold for a pattern (of a predetermined shape) on a substrate with high accuracy. In this case, there is a technique of matching relative shapes between the pattern on the substrate and the pattern of the mold by changing a shape of the mold using a magnification and shape correction mechanism provided in a mold holding mechanism.

In Japanese Patent Laid-Open No. 2017-79242, a plurality of actuators apply a force to a mold to adjust a shape of the mold, thereby reducing a shape error between a shot area (an area in which a pattern is formed) on a substrate and a pattern section of the mold. In Japanese Patent Laid-Open No. 2013-102132, a difference in shape between a pattern area of a mold and a pattern area on a substrate side is reduced using a mold shape correction mechanism that applies a force to the mold to deform the pattern area of the mold and a wafer heating mechanism that heats the pattern area on the substrate side to deform the pattern area on the substrate side. In these techniques, not only a magnification of a mold but also a shape thereof can be corrected by combining outputs of a plurality of drive mechanisms of a mechanism for applying a force to the mold.

However, in the above techniques, the outputs of the plurality of drive mechanisms are intended only to correct the magnification and shape of the mold, and thus, for example, there is an upper limit of an output of an actuator or the like, and a lower limit of the output due to the fact that a negative force, that is, a force in a pulling direction, cannot be generated in principle. For that reason, when some drive mechanisms reach upper limits of their outputs or lower limits of their outputs, a balance of a resultant force and a moment may be lost, and a holding position of the mold in a mold holding mechanism may shift.

SUMMARY OF THE INVENTION

The present invention is an imprint apparatus which forms a pattern of an imprint material on a substrate using a mold. The imprint apparatus includes a correction mechanism configured to correct a shape and a magnification of the mold, and a control unit configured to control the correction mechanism on the basis of differences in magnification and shape between the mold and the substrate. The imprint apparatus is characterized in that the control unit changes a shape coefficient multiplied by a correction amount of the shape to balance a resultant force and a moment on the mold applied by the correction mechanism on the basis of a magnification coefficient which is a coefficient multiplied by a correction amount of the magnification obtained through closed-loop control.

Further features of the present invention will become apparent from the following description of exemplary embodiments with reference to the attached drawings.

BRIEF DESCRIPTION OF THE DRAWINGS

FIGS. 9A and 9B are flowcharts showing an example of a main process according to the first embodiment.

DESCRIPTION OF THE EMBODIMENTS

Hereinafter, preferred embodiments of the present invention will be described in detail with reference to the accompanying drawings.

First Embodiment

Figure 1:
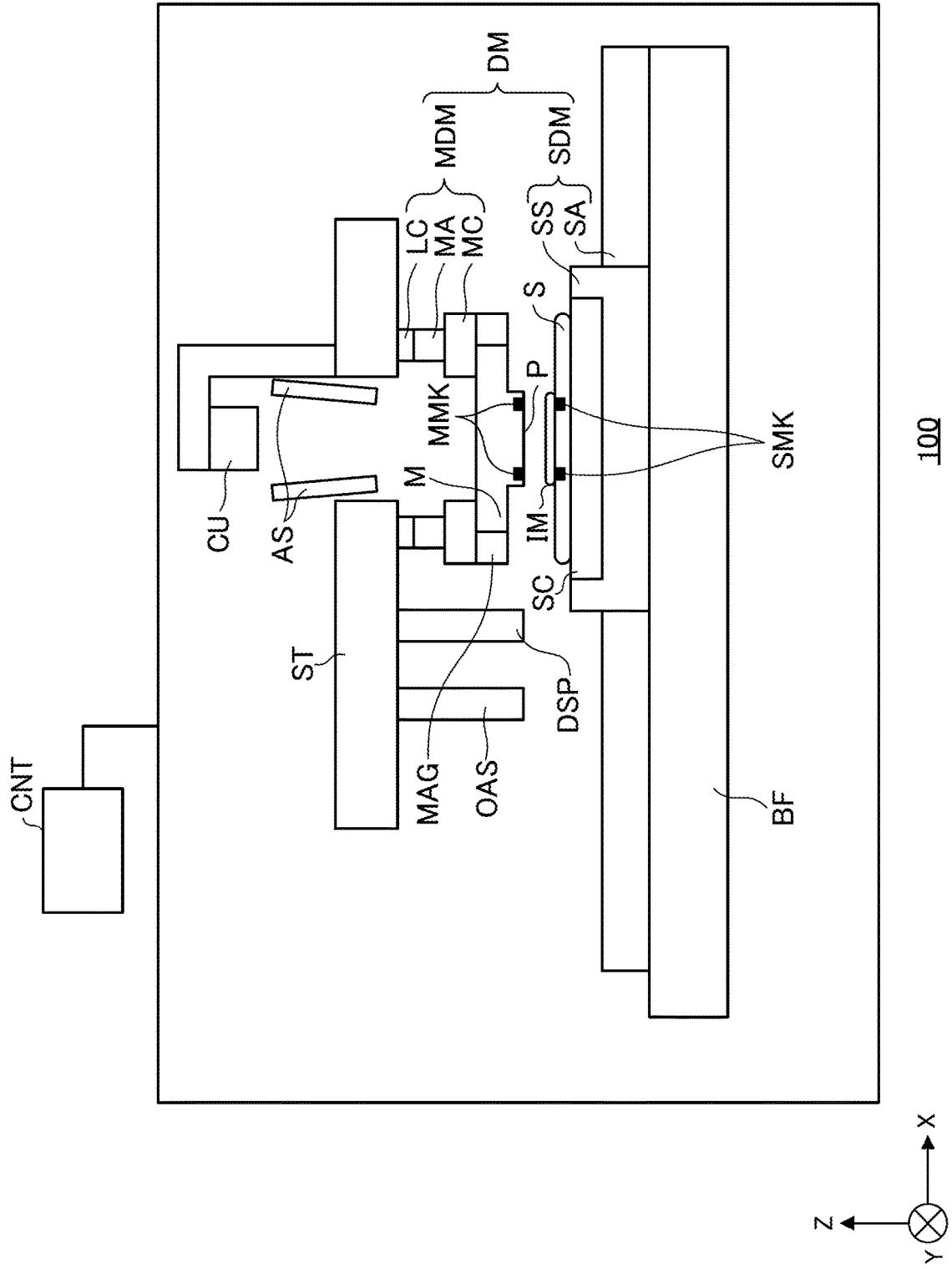
FIG. 1 is a schematic diagram showing a configuration of an imprint apparatus of a first embodiment.

FIG. 1 is a schematic diagram showing a configuration of an imprint apparatus 100 according to a first embodiment. The imprint apparatus 100 is a processing apparatus for transferring a pattern of a mold to a substrate, which is used in a process of manufacturing a semiconductor device. Here, a photo-curing method is used as an example.

The imprint apparatus 100 forms a pattern formed of a cured product of an imprint material IM on a substrate S through an imprint process. The imprint process may include a contact process, an alignment process, a curing process, and a separation (release) process. The contact process is a process of bringing a pattern area P of a mold M into contact with the imprint material IM on a shot area of the substrate S. The alignment process is a process for performing alignment of the shot area of the substrate S with the pattern area P of the mold M. The alignment process in the imprint process may include a deformation process of deforming the pattern area P of the mold M in order to reduce an overlay error between the shot area of the substrate S and the pattern area P of the mold M. The curing process is a process of curing the imprint material IM. The separation process is a process of separating (releasing) the pattern formed of the cured product of the imprint material IM and the pattern area P of the mold M.

For the imprint material, a curable composition (which may be referred to as a resin in a uncured state) that is cured by application of curing energy is used. For the curing energy, electromagnetic waves, heat and the like may be used. The electromagnetic waves may be, for example, light whose wavelength is selected from a range of 10 nm or more and 1 mm or less, for example, infrared light, visible light, ultraviolet light, or the like. The curable composition may be a composition that is cured by light irradiation or by heating. Among these, a photocurable composition which is cured by light irradiation contains at least a polymerizable compound and a photopolymerization initiator, and may further contain a non-polymerizable compound or a solvent as necessary. The non-polymerizable compound is at least one selected from the group consisting of a sensitizer, a hydrogen donor, an internal release agent, a surfactant, an antioxidant, and a polymer component. The imprint material may be disposed on the substrate in a droplet shape, or in an island shape or a film shape formed by connecting a plurality of droplets. A viscosity (viscosity at 25° C.) of the imprint material may be, for example, 1 mPa·s or more and 100 mPa·s or less.

For a material of the substrate, for example, glass, ceramics, a metal, a semiconductor, a resin, or the like can be used. A member made of a material different from the substrate may be provided on a surface of the substrate as necessary. The substrate is, for example, a silicon wafer, a compound semiconductor wafer, or quartz glass.

Figure 2:
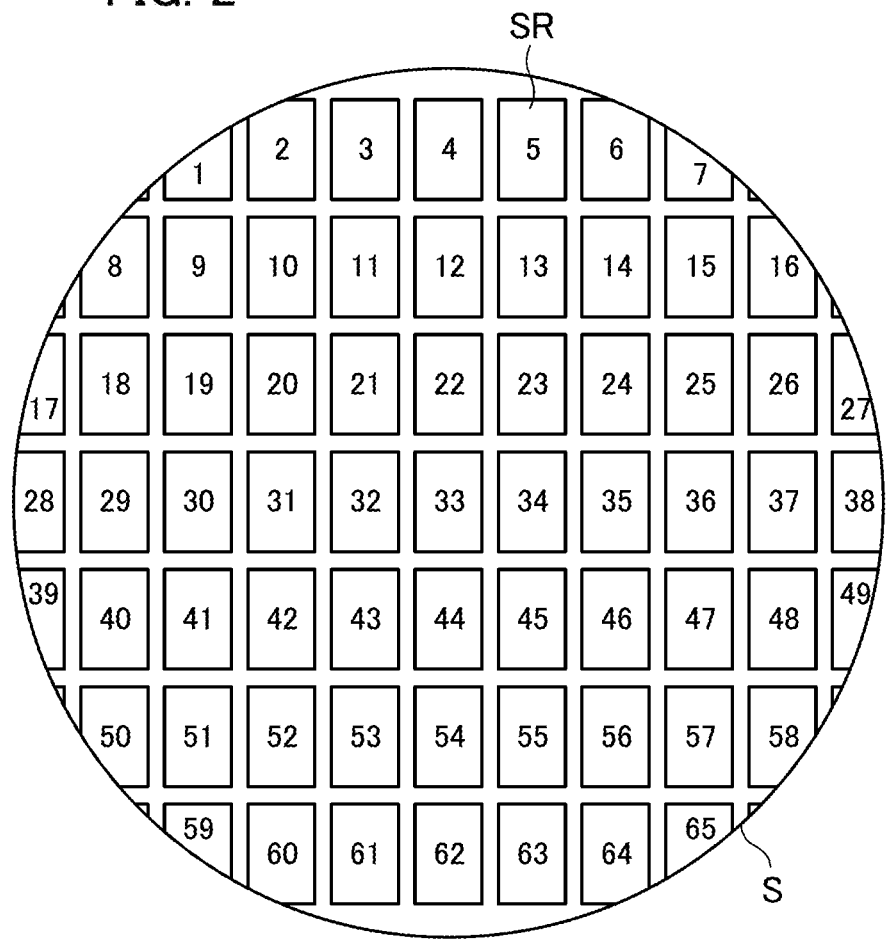
FIG. 2 is a schematic diagram showing an example of a substrate.

FIG. 2 is a schematic diagram showing an example of the substrate S. This figure shows an example of arranging a plurality of shot areas SR on the substrate S. Numbers shown in FIG. 2 are numbers (shot numbers) given to identify a plurality of shot areas SR from each other. The imprint process on the plurality of shot areas SR may be performed in a predetermined order.

In the present specification and the accompanying drawings, directions are shown in an XYZ coordinate system in which a direction parallel to the surface of the substrate S is an XY plane. Directions parallel to the X, Y, and Z axes in the XYZ coordinate system are defined as X, Y, and Z directions, respectively, and the rotation around the X axis, the rotation around the Y axis, and the rotation around the Z axis are defined as θX, θY, and θZ, respectively. Control or drive related to the X axis, the Y axis, or the Z axis indicates control or drive related to the direction parallel to the X axis, the direction parallel to the Y axis, or the direction parallel to the Z axis, respectively. Also, control or drive related to the θX axis, θY axis, and θZ axes indicates control or drive related to the rotation around an axis parallel to the X axis, rotation around an axis parallel to the Y axis, and rotation around an axis parallel to the Z axis, respectively. Further, positions are information that may be specified on the basis of coordinates on the X, Y, and Z axes, and postures are information that may be specified by values of the θX, θY, and θZ axes. Positioning indicates controlling a position and/or a posture. Alignment may include controlling a position and/or a posture of at least one of the substrate and the mold.

Returning to FIG. 1, the imprint apparatus 100 may include a substrate driving mechanism SDM which holds and drives the substrate S, a base frame BF which supports the substrate driving mechanism SDM, a mold driving mechanism MDM which holds and drives the mold M, and a structure ST which supports the mold driving mechanism MDM. The substrate driving mechanism SDM may include a substrate stage SS which includes a substrate chuck SC holding the substrate S, and a substrate positioning mechanism SA which positions the substrate stage SS thereby positioning the substrate S. The mold drive mechanism MDM may include a mold chuck MC which holds the mold M, and a mold positioning mechanism MA which positions the mold chuck MC thereby positioning the mold M. The mold driving mechanism MDM may include a load cell LC which detects a force applied to the mold M in the contact process and/or the separation process. Further, the mold driving mechanism MDM may include a pressure mechanism which applies pressure to a surface on a side opposite to the pattern area P to deform the pattern area P of the mold M such that the pattern area P of the mold M becomes convex toward the substrate S in the contact process.

The substrate driving mechanism SDM and the mold driving mechanism MDM constitute a driving mechanism DM which drives at least one of the substrate S and the mold M such that a relative position between the substrate S and the mold M is changed. The change of the relative position using the driving mechanism DM includes driving for contact of the pattern area P of the mold M with the imprint material on the substrate S and separation of mold from the cured imprint material (pattern of the cured product). In other words, the change of the relative position using the drive mechanism DM includes changing the relative position between the substrate S and the mold M such that the contact process and the separation process are performed. The substrate driving mechanism SDM may be configured to drive the substrate S relative to a plurality of axes (for example, three axes of the X, Y, and θZ axes, preferably, six axes of the X, Y, Z, θX, θY, and θZ axes). The mold driving mechanism MDM may be configured to drive the mold M relative to a plurality of axes (for example, three axes of the Z, θX, and θY axes, preferably, six axes of the X, Y, Z, θX, θY, and θZ axes).

The imprint apparatus 100 may further include a deformation mechanism MAG which deforms the pattern area P of the mold M. The deformation mechanism MAG may deform the pattern area P such that a shape (including a size) of the pattern area P in a plane parallel to the XY plane is changed. The deformation mechanism MAG may deform the pattern area P by applying forces to four side surfaces of the mold M, for example.

The imprint apparatus 100 may further include a dispenser DSP. However, the dispenser DSP may be configured as an external device of the imprint apparatus 100. The dispenser DSP supplies (applies) or disposes the imprint material IM in the shot area of the substrate S. The disposition of the imprint material IM in the shot area of the substrate S may be performed by the dispenser DSP discharging the imprint material IM in synchronization with each driving while the substrate S is being driven by the substrate driving mechanism SDM. Here, each time the dispenser DSP disposes the imprint material IM in one shot area on the substrate S, the contact process, the alignment process, the curing process, and the separation process may be executed. Alternatively, after the dispenser DSP disposes the imprint material IM in the plurality of shot areas on the substrate S, the contact process, the alignment process, the curing process, and the separation process may be performed on each of the plurality of shot areas.

The imprint apparatus 100 may further include a curing unit CU. The curing unit CU cures the imprint material IM by radiating curing energy on the imprint material IM while the pattern area P of the mold M is in contact with the imprint material IM on the substrate S. As a result, the pattern made of the cured product of the imprint material IM is formed on the substrate S.

The imprint apparatus 100 may further include an alignment scope (a measurement unit) AS which detects (measures) a position of a mark SMK in the shot area of the substrate S, a position of a mark MMK in the mold M, a relative position between the mark SMK in the shot area of the substrate S and the mark MMK in the mold M, and the like. The imprint apparatus 100 may further include an off-axis scope OAS which detects (measures) the position of the mark SMK in the shot area of the substrate S.

The imprint apparatus 100 may further include a control unit CNT. The control unit CNT may control the drive mechanism DM, the deformation mechanism MAG, the dispenser DSP, the curing unit CU, the alignment scope AS, and the off-axis scope OAS. For example, the control unit CNT may be configured of a programmable logic device (PLD) such as a field programmable gate array (FPGA) or an application specialized integrated circuit (ASIC), or a general-purpose computer in which a program is incorporated, or a combination of all or some of them.

The control unit CNT can calculate a shape of the shot area on the basis of the result detected by the alignment scope AS, for example, the position of the mark SMK in the shot area of the substrate S. Also, the control unit CNT can calculate a shape of the pattern area P of the mold M on the basis of the result detected by the alignment scope AS, for example, the position of the mark MMK of the mold M. On the basis of the shape of the shot area and the shape of the pattern area P obtained in this way, the control unit CNT may calculate and acquire an overlay error between the shot area of the substrate S and the pattern area P of the mold M. In other words, the control unit CNT may calculate and acquire a difference in shape between the shot area of the substrate S and the pattern area P of the mold M on the basis of the shape of the shot area and the shape of the pattern area P. Alternatively, the control unit CNT may calculate the overlay error between the shot area of the substrate S and the pattern area P of the mold M on the basis of the result detected by the alignment scope AS, for example, the relative position between the mark SMK of the substrate S and the mark MMK of the mold M. The overlay error may include, for example, a magnification component, and a distortion component (for example, a component having a rhombic shape, a trapezoidal shape, or the like, or a component having a higher order).

Figure 3:
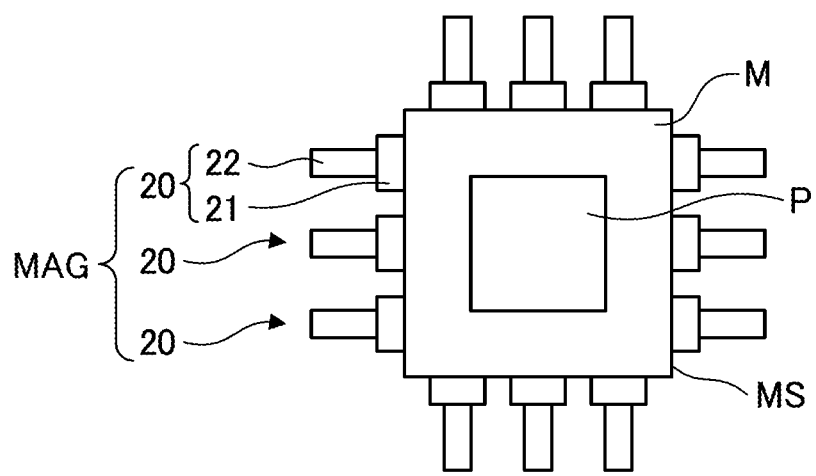
FIG. 3 is a schematic diagram showing a configuration of a deformation mechanism.

Next, an example of a detailed configuration of the deformation mechanism MAG will be described with reference to FIG. 3. FIG. 3 is a schematic diagram showing a configuration example of the deformation mechanism MAG. The deformation mechanism MAG may deform the pattern area P of the mold M by applying forces to four side surfaces MS of the mold M. The deformation mechanism MAG is a correction mechanism that physically deforms the mold by applying external forces from sides of the mold M. By applying forces to the sides of the mold M, the shape of the pattern area P of the mold M is corrected. By making the pattern area P a desired shape through this correction, the difference between the shape of the pattern (shot area) formed on the substrate and the shape of the pattern area P formed in the mold can be reduced. Thus, overlay accuracy of the pattern formed on the substrate and the pattern of the imprint material newly formed on the substrate can be improved.

Components of the shape (including the size) of the pattern area P that can be controlled by the deformation mechanism MAG may include, for example, a magnification component, and a distortion component (for example, a component having a rhombic shape, a trapezoidal shape, or the like, or a component having a higher order). The deformation mechanism MAG may include a plurality of units 20. Each unit 20 may include a contact portion 21 which comes into contact with the side surface MS of the mold M, and an actuator 22 which drives the contact portion 21. The actuator 22 may include, for example, a piezo element, and may include other elements.

Figure 4:
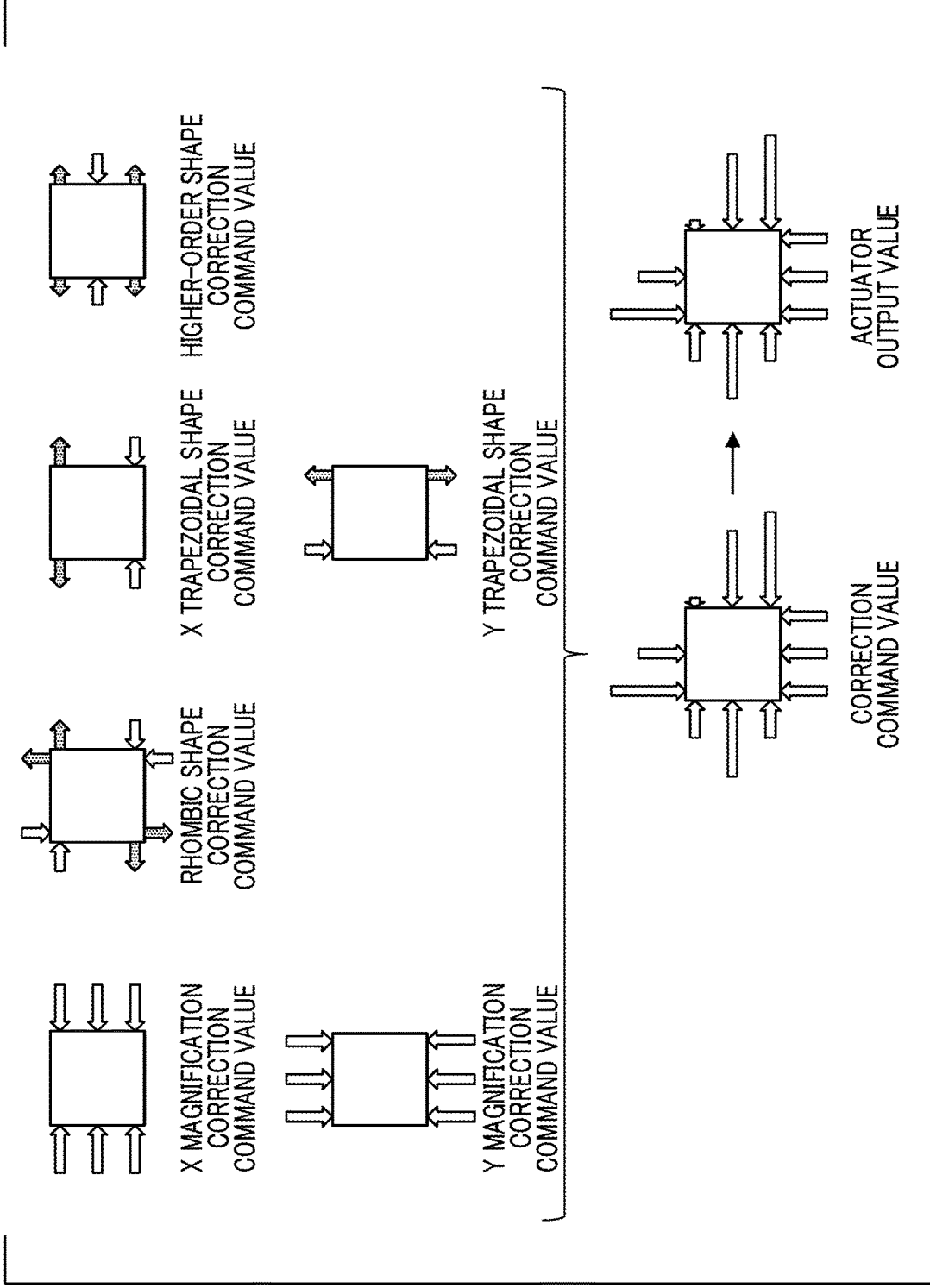
FIG. 4 is a diagram illustrating a first example of a correction performed by the deformation mechanism.

FIG. 4 is a diagram illustrating a first example of a correction using the deformation mechanism MAG. This figure is a diagram showing how command values to the deformation mechanism MAG and output values of actuators are determined from correction command values of each magnification and shape in the case of correcting a rhombic shape, a trapezoidal shape, and a higher-order shape as examples of correction magnifications and correction shapes. Further, here, the higher-order shape is a shape having sides expressed by higher-order functions than the rhombic shape and the trapezoidal shape, and includes, for example, a bow shape, a bobbin shape, or the like. In this figure, a resultant force and a moment are balanced in each component of the command values. In addition, in the present example, although there are negative command values (dotted arrows in the figure) in shape correction command values, the command values to the deformation mechanism MAG obtained by adding all of magnification correction amounts and shape correction amounts fall within upper and lower limits of driving forces in all the driving mechanisms. For that reason, the command values are directly used as the output values of the actuators.

Figure 5:
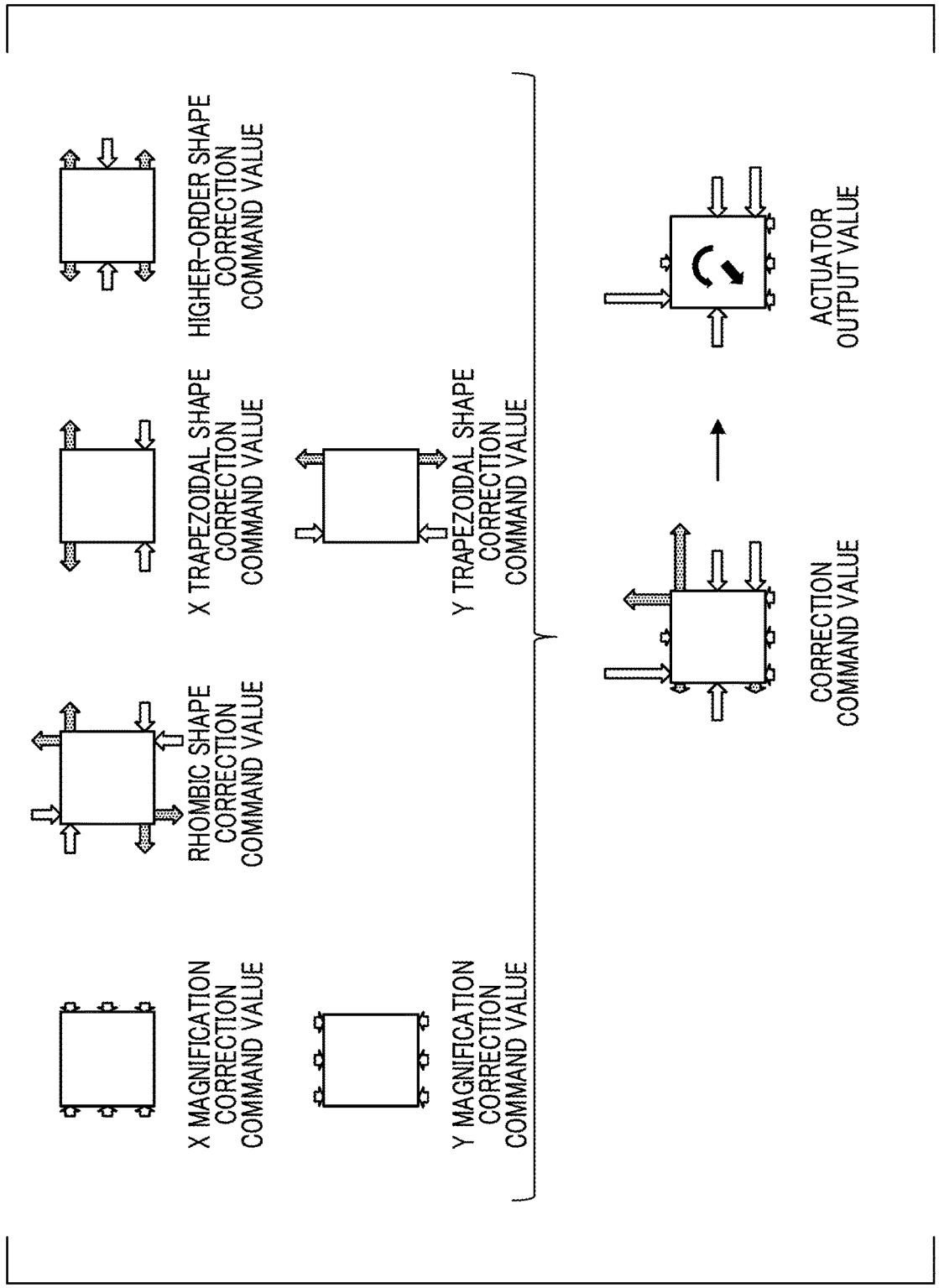
FIG. 5 is a diagram illustrating a second example of the correction performed by the deformation mechanism.

FIG. 5 is a diagram illustrating a second example of the correction using the deformation mechanism MAG. This figure is a diagram showing how the command values to the deformation mechanism MAG and the output values of the actuators are determined from the correction command values of each magnification and shape in the case of correcting the rhombic shape, the trapezoidal shape, and the higher-order shape as examples of the correction magnifications and the correction shapes. The resultant force and moment are balanced in each component of the command value. Also, in the present example, there are negative command values (dotted arrows in the figure) in the shape correction command values, the negative command values in the command values to the deformation mechanism MAG obtained by adding all of the magnification correction amounts and the shape correction amounts are also given to some actuators. On the other hand, since the deformation mechanism MAG cannot output a negative output from its structure in principle, the actuators that have received the negative command values output zero and lower limit values of the outputs of the actuators. In this case, the balanced correlation between the resultant force and the moment of the outputs of the actuators may be lost, and the mold M may shift from the mold chuck MC.

Figure 6:
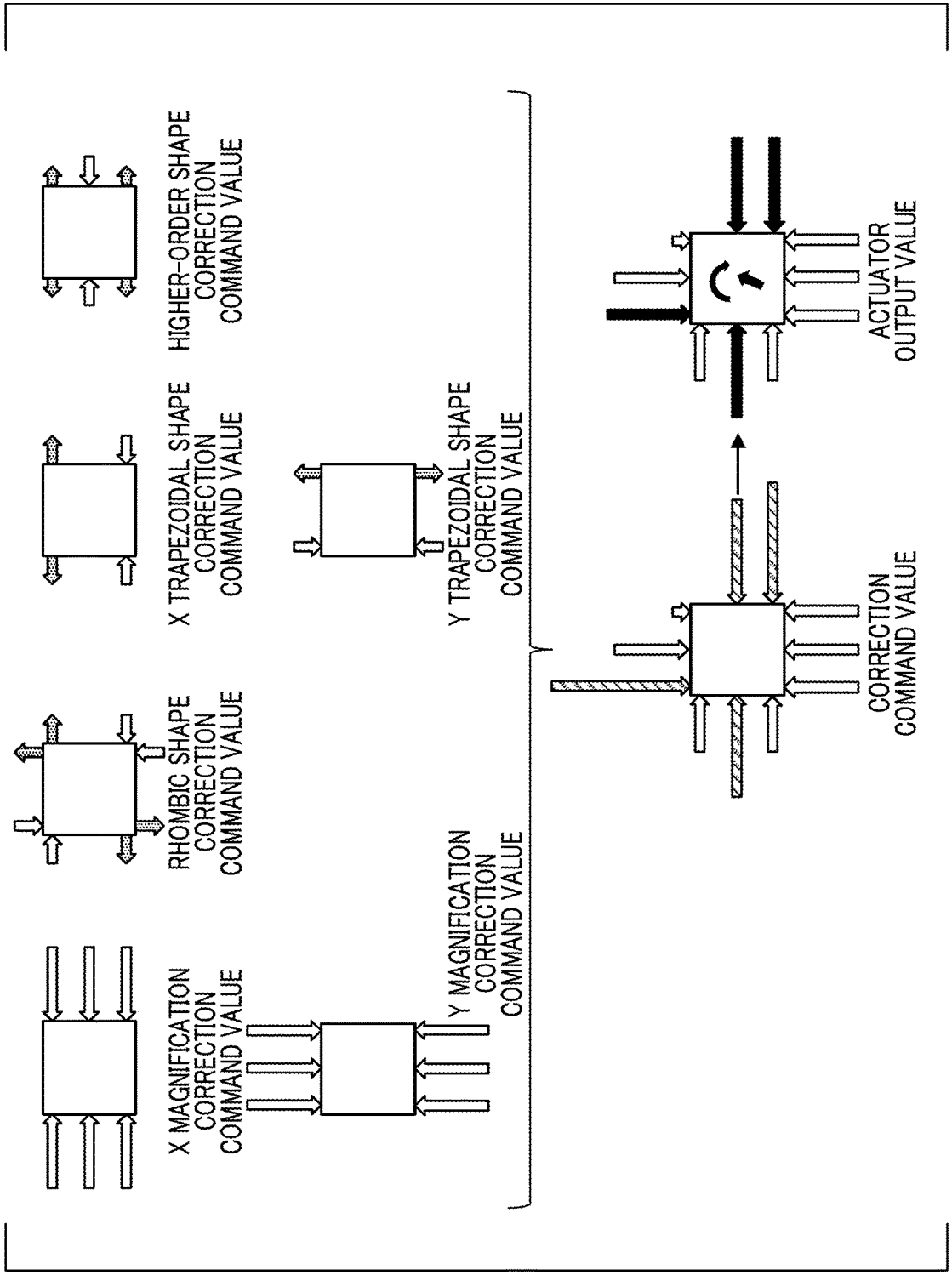
FIG. 6 is a diagram illustrating a third example of the correction performed by the deformation mechanism.

FIG. 6 is a diagram illustrating a third example of the correction using the deformation mechanism MAG. This figure is a diagram showing how the command values to the deformation mechanism MAG and the output values of the actuators are determined from the correction command values of each magnification and shape in the case of correcting the rhombic shape, the trapezoidal shape, and the higher-order shape as examples of the correction magnifications and the correction shapes. The resultant force and the moment are balanced in each component of the command values. Also, in the present example, there are negative command values (dotted arrows in the figure) in the shape correction command values. Further, since the magnification correction amounts are larger, there is no negative command value in the command values to the deformation mechanism MAG obtained by adding all of the magnification correction amounts and shape correction amounts. However, command values (hatched arrows in the figure) that are equal to or more than upper limit values of the outputs of the actuators are given to some actuators. The actuators that have received the command values equal to or higher than the upper limit values of the outputs of the actuators output the upper limit values of the outputs of the actuators. In this case, the balanced correlation between the resultant force and the moment of the outputs of the actuators may be lost, and the mold may be shifted between the mold M and the mold chuck MC.

Figure 7:
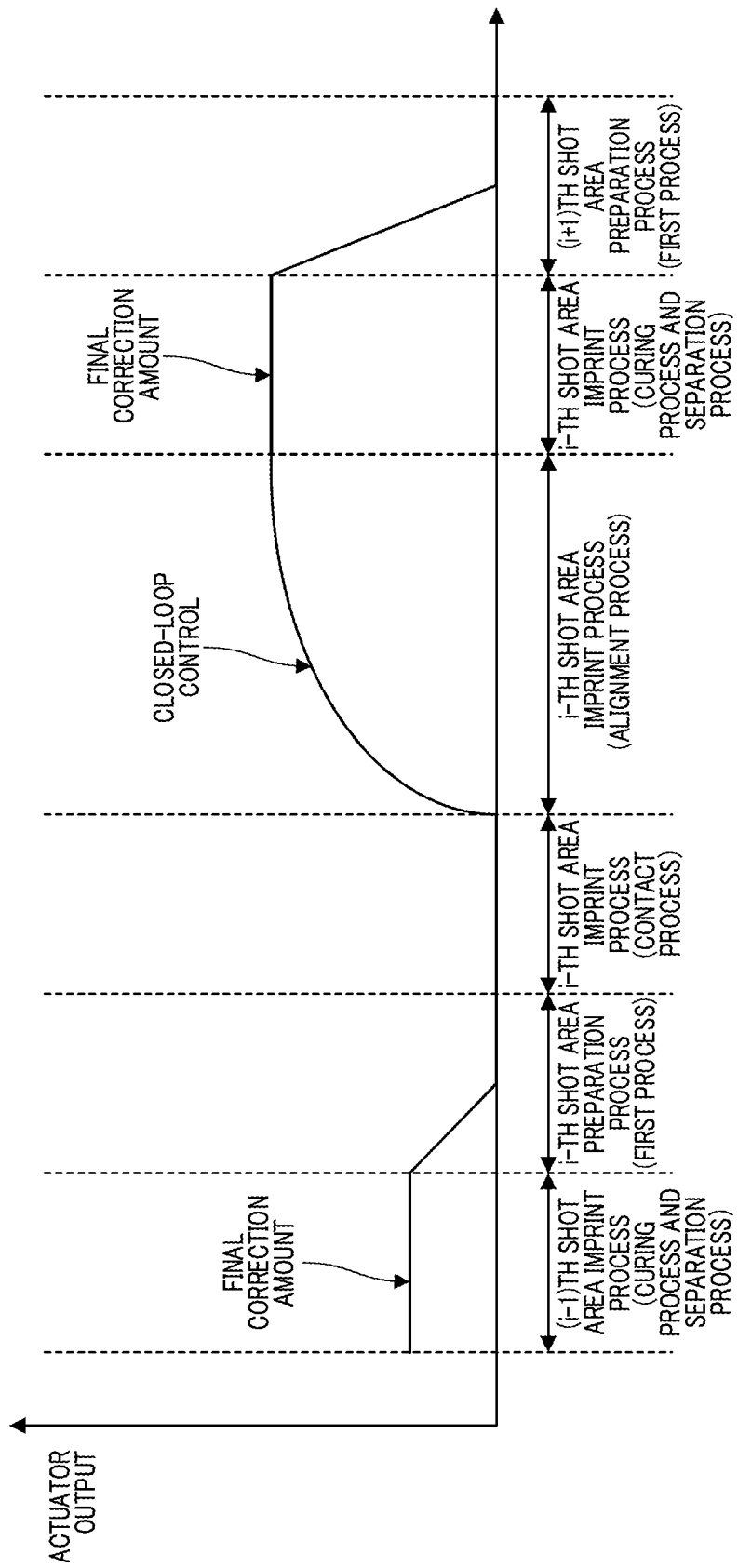
FIG. 7 is a diagram showing an example of an output value of an actuator.

FIG. 7 is a diagram showing an example of the output values of the actuators. In this figure, an output value of a certain actuator is shown in a time series when a relative magnification and a relative shape obtained from a measurement result of a relative position between the mark on the substrate and the mark on the mold are imprinted in real time while the deformation mechanism MAG is controlled through closed-loop control. In the case of making magnification and shape corrections on the basis of the closed-loop control, in order to reduce an influence of hysteresis, there is a method of pre-driving the deformation mechanism MAG at the start of correction to the upper limit, the lower limit, or an amount determined relative to a predicted final-reaching correction amount. FIG. 7 shows a case in which the deformation mechanism MAG is released to the lower limit in advance, but the present embodiment does not limit an amount of pre-driving.

Figure 8:
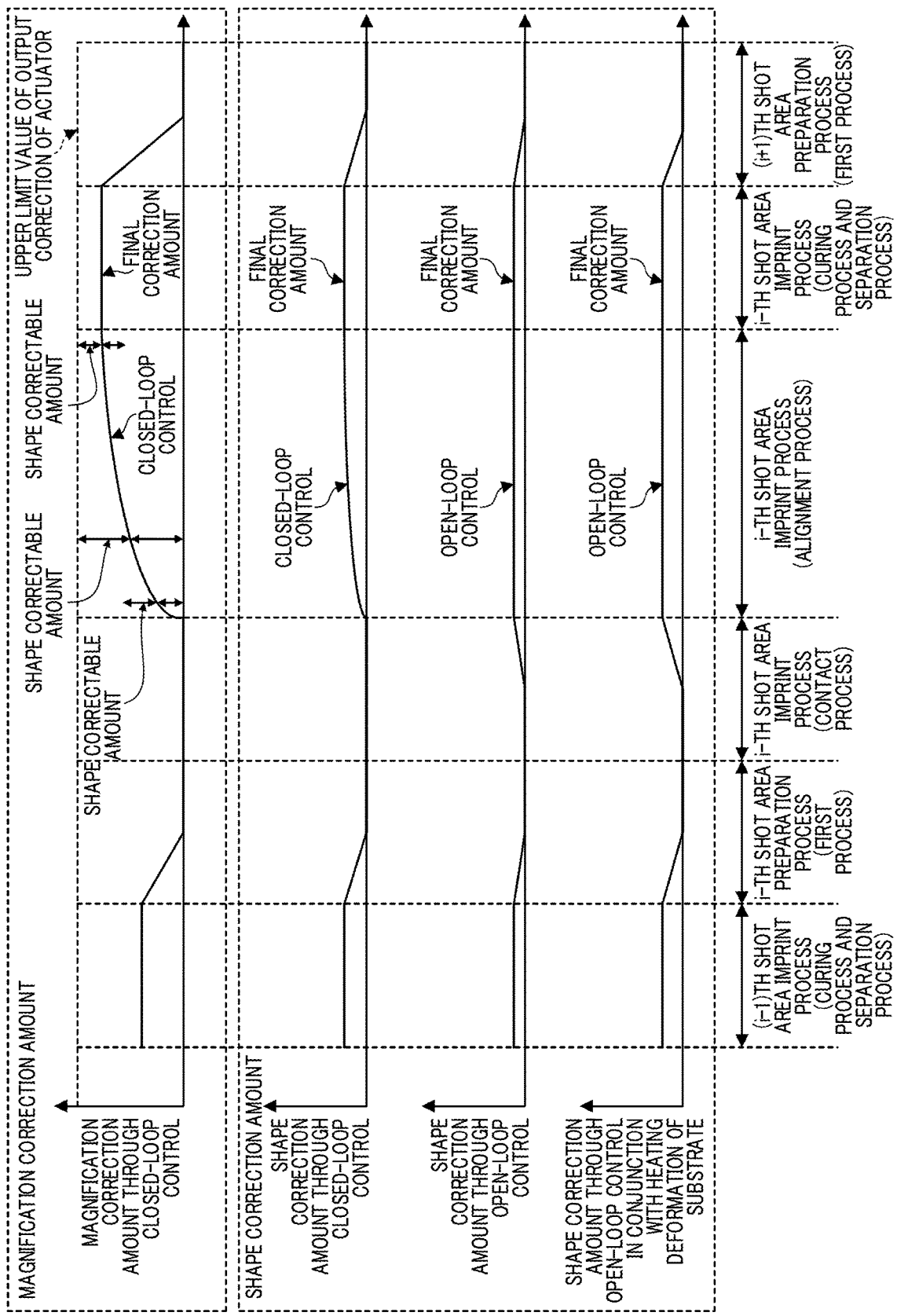
FIG. 8 is a diagram showing respective correction amounts at the time of a correction in FIG. 7.

FIG. 8 is a diagram showing each correction amount at the time of correction in FIG. 7. This figure shows each correction component including a shape obtained through an open-loop correction at the time of correction through the closed-loop control shown in FIG. 7. That is, a magnification correction amount obtained through the closed-loop control, a shape correction amount obtained through the closed-loop control, a shape correction amount obtained through open-loop control, and a shape correction amount obtained through the open-loop control in combination with heating (heat input) deformation to a substrate are shown in a time series.

As described in FIGS. 4, 5, and 6, the magnification correction is a positive command value to the deformation mechanism MAG, whereas the shape correction includes a positive command value and a negative command value regardless of the control method. This indicates that the deformation mechanism MAG cannot correct only the shape and can perform the shape correction including a negative output on the premise that an output value for the magnification correction is being given. That is, as shown in FIG. 8, a positive output value is given to the deformation mechanism MAG due to the magnification correction through the closed-loop control, and a negative shape correctable amount is assigned on the basis of the positive output value. Further, when the magnification correction amount increases, a remaining amount of the output of the actuator up to the upper limit value decreases, and accordingly, a positive shape correctable amount also decreases.

In an i-th shot area in FIG. 8, the shape command value corrected through the open-loop control in which a correction amount is determined in advance is given to each actuator between an i-th shot area preparation process (a first process) and an i-th shot area imprint process (the contact process). Before the start of the i-th shot area imprint process (the alignment process), the shape command value is set in each actuator.

On the other hand, in the magnification correction through the closed-loop control, in order to reduce the influence of hysteresis, a release command value is given to each actuator as pre-driving, and a magnification correction amount starts to be given from the start of alignment. For that reason, in an initial state of alignment, the magnification command values become small as in the second example shown in FIG. 5, and thus, in the command values obtained by adding all of the magnification and shape command values, negative command values are generated, and the balanced correlation between the resultant force and the moment of the outputs of the actuators may be lost. Then, the mold M and the mold chuck MC may shift from each other. Further, in the case in which a magnification of the mold with respect to the substrate is extremely large or a magnification of the substrate with respect to the mold is extremely small, in consideration of a correctable range, the correction command values may exceed the upper limit values of the outputs of the actuators at the end of the closed-loop control, as in FIG. 6. Then, the balanced correlation between the resultant force and the moment of the outputs of the actuators may be lost, and the mold M and the mold chuck MC may shift from each other.

A process for avoiding the shift of the mold that occurs when the balance between the resultant force and the moment applied to the mold M is lost will be described with reference to FIGS. 9 to 14.

FIGS. 9A and 9B are flowcharts showing an example of a main process of the imprint apparatus according to the first embodiment. FIG. 9A is a flowchart showing an example of the main process of the imprint apparatus according to the first embodiment. Each operation (step) shown in this flowchart may be executed through control of each unit performed by the control unit CNT.

First, for example, the mold M is conveyed into the imprint apparatus using a mold conveyance device (not shown), and the mold M is set on the mold chuck MC of the mold driving mechanism MDM (S101). Next, the control unit CNT sets imprint conditions (S102). The imprint conditions are conditions for performing the imprint process and may include, for example, an order of shots to be imprinted, a supply amount and arrangement of the imprint material to the substrate S, and the like. Further, a filling time which is a time for bringing the mold M into contact with the imprint material IM on the substrate, an exposure time which is a time for radiating the curing energy from the curing unit CU to cure the imprint material IM, and the like may be included.

Next, for example, the substrate S is conveyed into the imprint apparatus using a substrate conveyance device (not shown), placed on the substrate chuck SC of the substrate driving mechanism SDM, and thus conveyed in (loaded) (S103). Thereafter, in order to detect a state of the substrate S, for example, an inclination and a height of the surface of the substrate S are measured using substrate measurement sensors (not shown) (S104). Then, the imprint process is performed on the substrate S (S105), and the substrate is conveyed out (unloaded) (S106). S103 to S106 are repeated until the imprint process is completed for all the substrates, and when the imprint process has been completed for all the substrates (S107, YES), the process is terminated.

Here, a detailed flow of the imprint process and driving of the deformation mechanism MAG will be described with reference to FIG. 9B. FIG. 9B is a flowchart showing an example of the imprint process of the imprint apparatus according to the first embodiment. Each operation (step) shown in this flowchart may be executed through control of each unit performed by the control unit CNT.

The substrate stage SS is moved such that the shot area (for example, the i-th shot area) on which the imprint process is performed is disposed directly below the pattern area P (S111). Thereafter, the preparation process (first process) is performed (S112). In the present embodiment, as an example, the output value of the deformation mechanism MAG is released to the lower limit as pre-driving in the preparation process in order to reduce the influence of hysteresis. At this time, the output value of the deformation mechanism MAG from the start of driving toward a pre-driving position to the start of pre-driving can be obtained by the following equation.

$$F_n(t_{0 \to 1}) = \frac{L(D_n) - f_n}{t_1 - t_0}(t - t_0) + f_n \qquad \text{[Equation 1]}$$

In the above equation, the symbol $F_n$ indicates the output value of the deformation mechanism MAG. The symbol t indicates time, the symbol $t_0$ indicates a driving start time toward the pre-driving position, and the symbol $t_1$ indicates a pre-driving start time. The symbol $f_n$ indicates a final output value of the deformation mechanism MAG at the time of the imprint process on an immediately previous shot area (for example, an (i−1)th shot area), and the symbol n indicates an identification number of the deformation mechanism MAG The symbol $D_n$ indicates a pre-driving target value.

Also, from the start of pre-driving to the end of pre-driving, in other words, the output value of the deformation mechanism MAG during the pre-driving can be obtained by the following equation.

$$F_n(t_{1 \to 2}) = L(D_n) \qquad \text{[Equation 2]}$$

In the above equation, the symbol $t_2$ indicates a pre-driving end time. In the present embodiment, since the deformation mechanism MAG is released to the lower limit as pre-driving, the output value of the deformation mechanism MAG during the pre-driving is the same as the lower limit value of the deformation mechanism MAG. Further, an output limit of the deformation mechanism MAG can be expressed by the following equation.

$$L(F_n) = \begin{cases} F_{min} & (F_n < F_{min}) \\ F_n & (1 \le F_n \le F_{max}) \\ F_{max} & (F_{min} \le F_n) \end{cases} \qquad \text{[Equation 3]}$$

Thereafter, the contact process for bringing the imprint material IM on the substrate S into contact with the pattern area P of the mold M is performed (S113). The output value of the deformation mechanism MAG at this time, that is, the output value of the deformation mechanism MAG from the pre-driving end time to the start of the alignment process in the next process, can be expressed by the following equation.

$$F_n(t_{2 \to 3}) = \frac{F_n(t_3) - F_n(t_2)}{t_3 - t_2}(t - t_2) + F_n(t_2) \qquad \text{[Equation 4]}$$

In the above equation, the symbol $t_3$ indicates a start time of the alignment process. Further, the output value of the deformation mechanism MAG at the alignment process start time can be expressed by the following equation.

$$F_n(t_3) = L(k_m(t_3) \cdot C_n(Sx,Sy,0,0,0)) + k_1(t_3) \cdot C_n(0,0,Sk,0,0) + k_2(t_3) \cdot C_n(0,0,0,Tx,Ty) + k_3(t_3) \cdot H_n \qquad \text{[Equation 5]}$$

In the above equation, the symbol $C_n$(Sx, Sy, Sk, Tx, Ty) indicates an output conversion matrix from the corrected shape to the deformation mechanism MAG. The symbol Sx indicates an X magnification, the symbol Sy indicates a Y magnification, the symbol Sk indicates a correction command value for the rhombic shape, the symbol Tx indicates a correction command value for an X trapezoidal shape, and the symbol Ty indicates a correction command value for a Y trapezoidal shape. The symbol $H_n$ indicates a correction command value for the deformation mechanism MAG of the higher-order shape. The symbol $k_m$ indicates a magnification coefficient, the symbol $k_1$ indicates a first coefficient, the symbol $k_2$ indicates a second coefficient, and the symbol $k_3$ indicates a third coefficient.

Thereafter, in a state in which the imprint material IM on the substrate S and the pattern area P of the mold M are brought into contact with each other, the alignment process is performed to deform the pattern area and the shot area such that the shape of the pattern area P and the shape of the shot area SR approach each other (S114). The output value of the deformation mechanism MAG at the time of the alignment process can be expressed by the following equation.

$$F_n(t) = L(k_m(t) \cdot C_n(Sx,Sy,0,0,0)) + k_1(t) \cdot C_n(0,0,Sk,0,0) + k_2(t) \cdot C_n(0,0,0,Tx,Ty) + k_3(t) \cdot H_n \qquad \text{[Equation 6]}$$

Thereafter, in a state in which the imprint material IM on the substrate S and the pattern area P of the mold M are brought into contact with each other, the curing energy is radiated from the curing unit CU to the imprint material on the shot area to be imprinted via the mold M. Then, the cured imprint material and the mold M are separated (released) (S115). Thus, a pattern of the imprint material corresponding to the pattern of the pattern area P of the mold M remains in the shot area of the substrate S to be imprinted. That is, the pattern corresponding to the pattern in the pattern area of the mold M is formed in the shot area of the substrate S to be imprinted. S111 to S115 are repeated until the imprint process is completed for all shot areas on the substrate. Then, when the imprint process has been completed for all shot areas (S116, YES), the imprint process for the target substrate is completed, and the process proceeds to S106.

Figure 10:
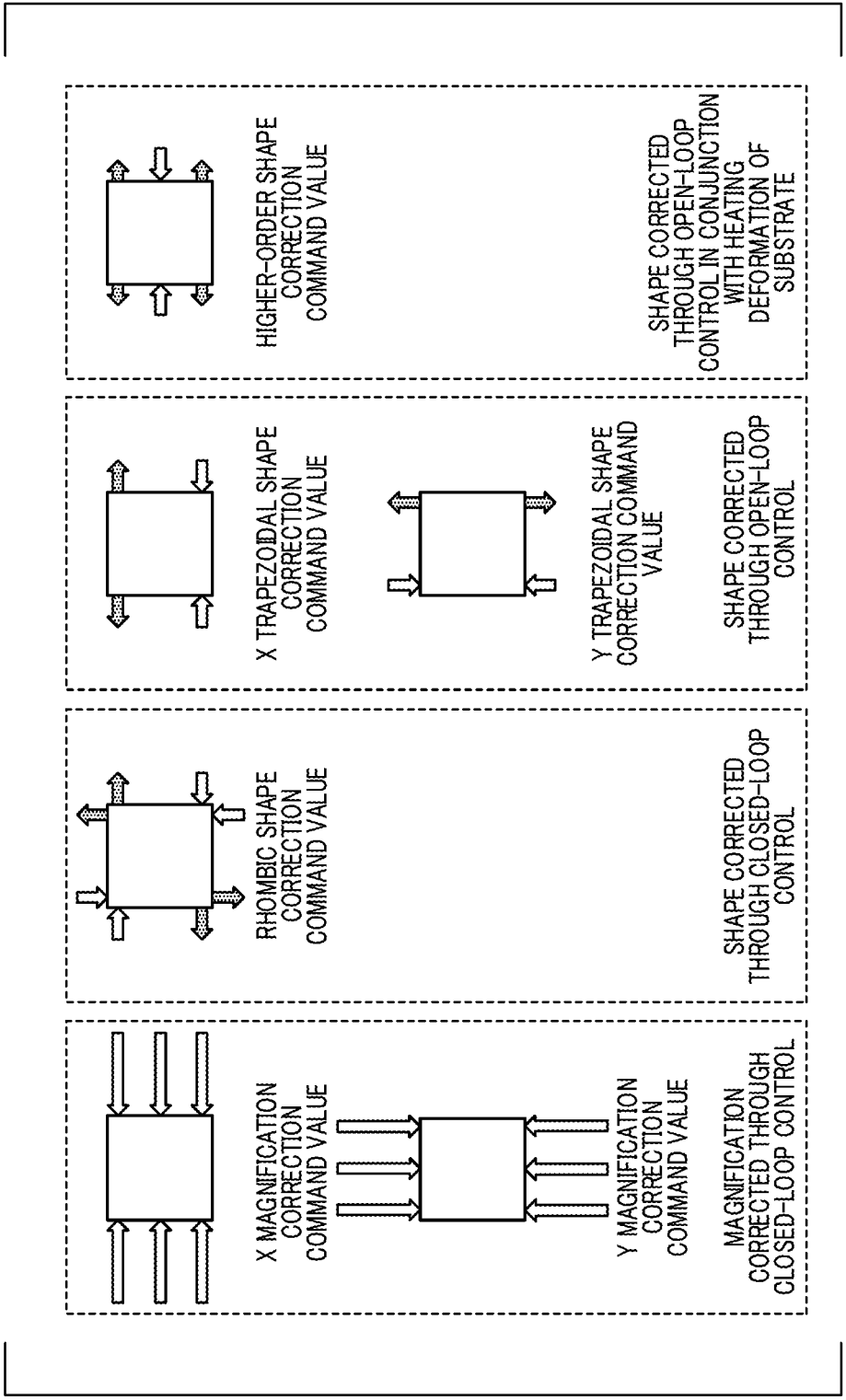
FIG. 10 is a diagram illustrating a state in which each correction component of the third example according to the first embodiment is separated.

In the first embodiment, as shown in FIG. 10, each magnification and shape correction amount is divided into a magnification to be corrected through the closed-loop control, a shape to be corrected through the closed-loop shape, a shape to be corrected through the open-loop control, and a shape to be corrected through the open-loop control in conjunction with a heating deformation of the substrate Then, the control unit CNT changes a coefficient multiplied by each correction command value between 0 and 1 in real time and determines the coefficient multiplied by each correction command value such that the correction command value that is changed in real time through the closed-loop control should be within the upper and lower limits of the outputs of the actuators. In order to describe a more specific method for determining the coefficient, a case in which the correction command values reach the upper limit values of the outputs of the actuators due to the magnification correction through the closed-loop control as shown in FIG. 6 will be described as an example.

FIG. 10 is a diagram showing a state in which each correction component of the third example according to the first embodiment is separated. That is, this figure shows a state in which each correction component shown in FIG. 6 is divided into a magnification to be corrected through the closed-loop control, a shape to be corrected through the closed-loop control, a shape to be corrected through the open-loop control, and a shape to be corrected through the open-loop control in conjunction with the heating deformation of the substrate. The control unit CNT determines, on the basis of each of these correction amounts, a magnification coefficient which is a coefficient to be multiplied by the magnification correction amounts through the closed-loop control, and a first coefficient, a second coefficient and a third coefficient, which are shape coefficients to be multiplied by the shape correction amounts. The control unit CNT determines the coefficient to be multiplied by each correction command value such that it falls within a range between the upper and lower limits of the outputs of the actuators. Also, each coefficient is determined in the order of, for example, the magnification coefficient, the first coefficient, the second coefficient, and the third coefficient.

Figure 11:
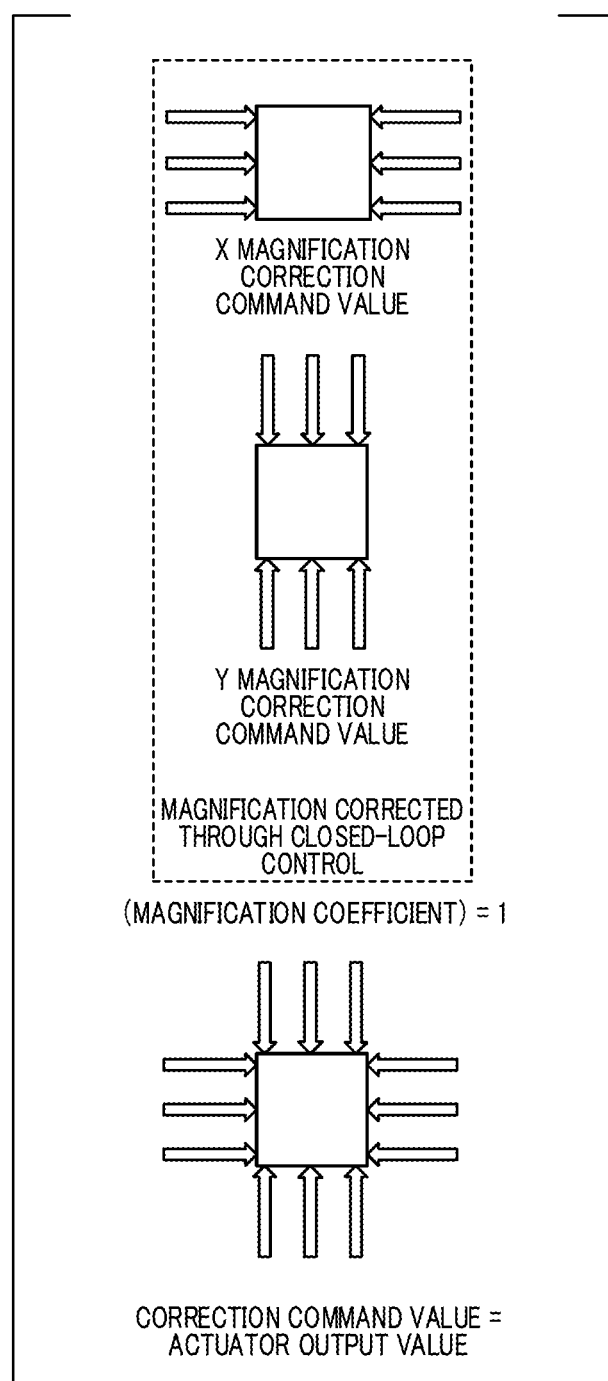
FIG. 11 is a diagram illustrating determination of a magnification coefficient.

FIG. 11 is a diagram illustrating determination of the magnification coefficient. This figure shows the magnification to be corrected through the closed-loop control of FIG. 10. The magnification coefficient to be multiplied for the magnification correction of the closed-loop control is preferably 1. The first reason is that an influence degree on the overlay accuracy is often greater than other shapes. The second reason is that, even when a difference in relative magnification between the shot area of the substrate S and the pattern area P of the mold M is out of a correction range and the command value reaches the upper and lower limits in the magnification component, the balance between the resultant force and the moment of the command value is not easily lost. In FIG. 11, only the magnification correction command value falls within the range of the upper and lower limits of the outputs of the actuators. However, even when it is out of the range, the resultant force and the moment are balanced, and it becomes a correction amount that can be corrected to the maximum within the range of the upper and lower limits of the outputs. Therefore, in the present embodiment, the magnification coefficient is 1.

Figure 12:
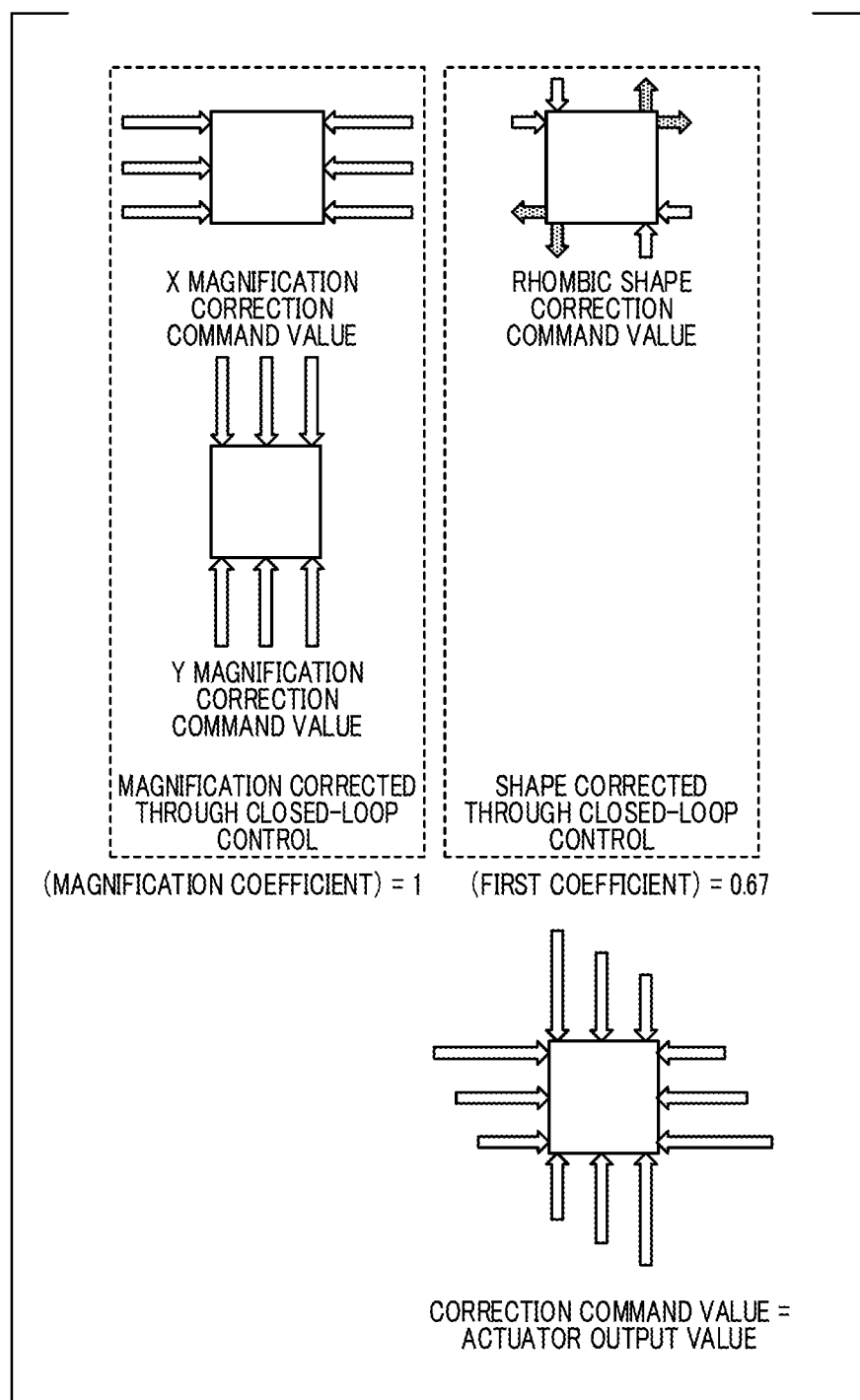
FIG. 12 is a diagram illustrating determination of a first coefficient.

FIG. 12 is a diagram illustrating determination of the first coefficient. This figure shows the magnification coefficient, the magnification to be corrected through the closed-loop control of FIG. 10, and the shape to be corrected through the closed-loop control of FIG. 10. Here, as an example, the rhombic shape is corrected through the closed-loop control. The first coefficient to be multiplied for the shape correction of the closed-loop control is determined such that a total correction command value is within the range between the upper and lower limits in all actuators on the basis of the magnification coefficient (=1), the correction command value of the magnification to be corrected through the closed-loop control, and the upper and lower limits of the outputs of the actuators. In the example of FIG. 12, the first coefficient is set to 0.67. As a result, the total correction command values are within the upper and lower limits in the output values of all actuators.

Figure 13:
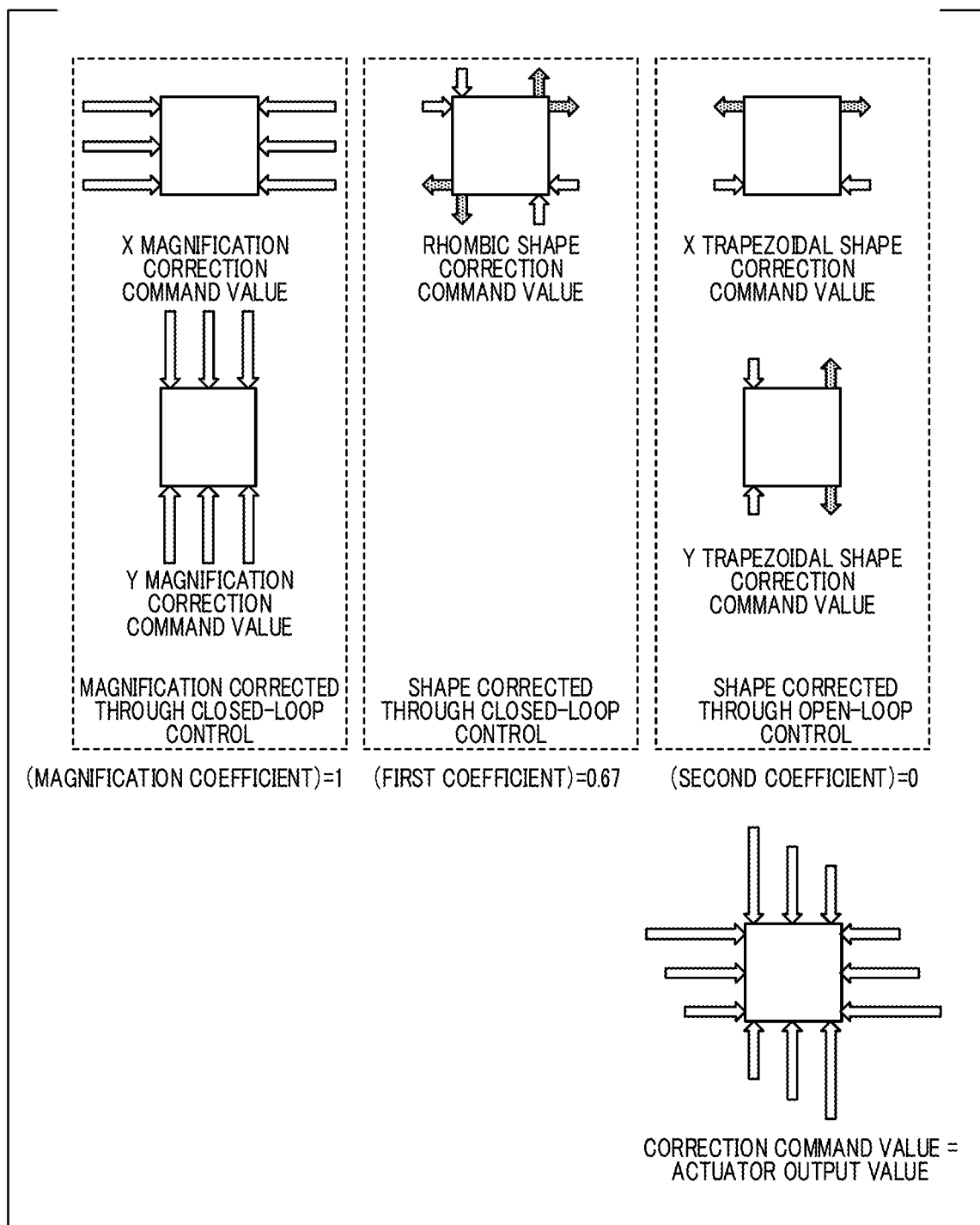
FIG. 13 is a diagram illustrating determination of a second coefficient.

FIG. 13 is a diagram illustrating determination of the second coefficient. FIG. 13 shows the magnification coefficient, the magnification to be corrected through the closed-loop control of FIG. 10, the first coefficient, the shape to be corrected through the closed-loop control of FIG. 10, and the shape to be corrected through the open-loop control of FIG. 10. Here, as an example, the trapezoidal shape is corrected through the open-loop control. The second coefficient is determined on the basis of the magnification correction command value through the closed-loop control that has been multiplied by the magnification coefficient (=1), the shape correction command value through the closed-loop control that has been multiplied by the first coefficient (=0.67), and the upper and lower limits of the outputs of the actuators. On the basis of these, the second coefficient is determined such that the total correction command values are all within the range of the upper and lower limits of the outputs of the actuators. In the example of FIG. 13, the second coefficient is set to 0. As a result, the total correction command values are all within the upper and lower limits of the output values of the actuators.

Figure 14:
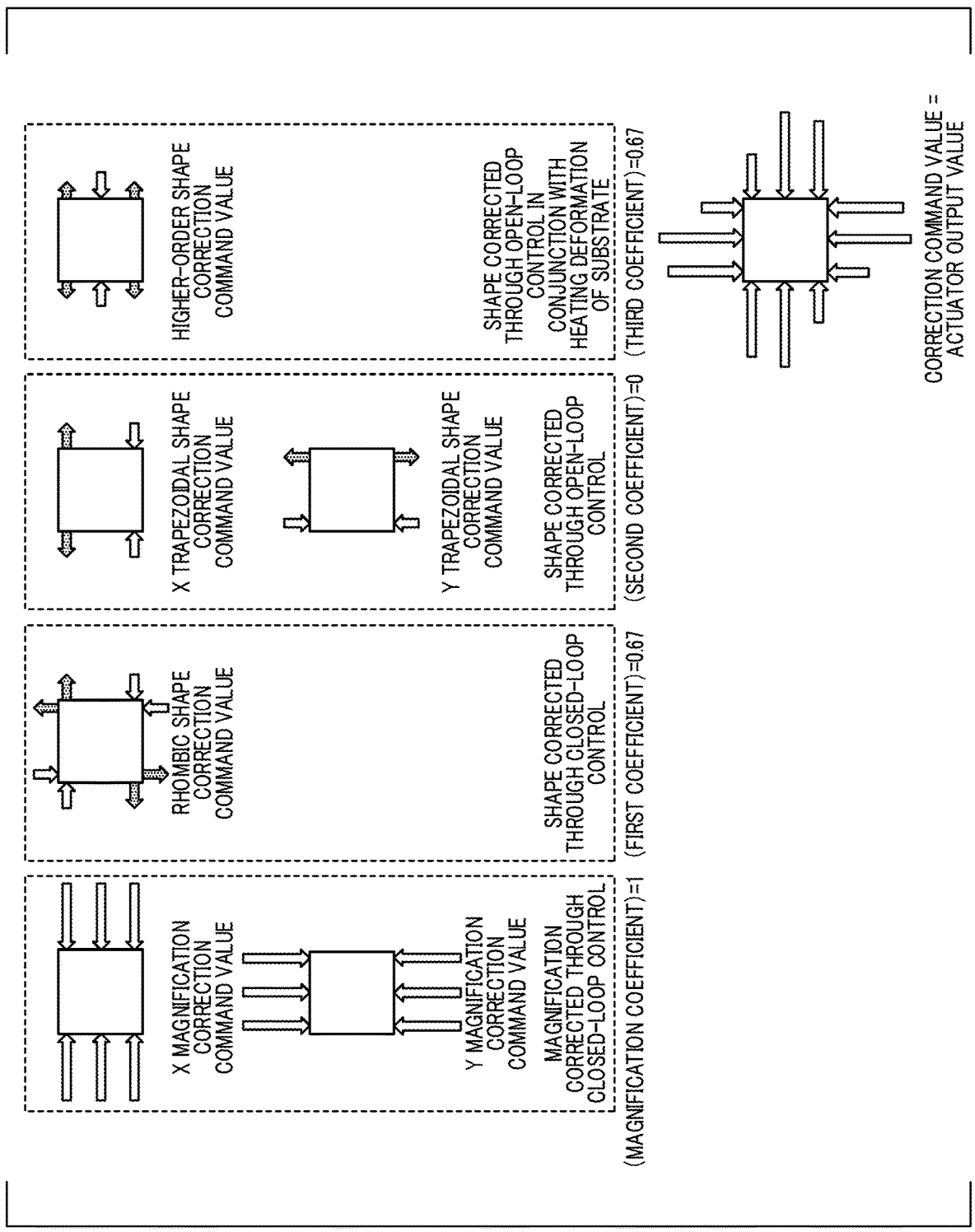
FIG. 14 is a diagram illustrating determination of a third coefficient.

FIG. 14 is a diagram illustrating determination of the third coefficient. FIG. 14 shows the magnification coefficient, the magnification to be corrected through the closed-loop control of FIG. 10, the first coefficient, the shape to be corrected through the closed-loop control of FIG. 10, the second coefficient, the shape to be corrected through the open-loop control of FIG. 10, and the shape to be corrected through the open-loop control in conjunction with the heating deformation of the substrate 11 of FIG. 11. Here, as an example, the higher-order shape is corrected through the open-loop control in conjunction with the heating deformation. The third coefficient is a coefficient to be multiplied by the shape to be corrected through the open-loop control in conjunction with the heating deformation of the substrate. The third coefficient is determined on the basis of the magnification correction command value through the open-loop control that has been multiplied by the magnification coefficient (=1), the shape correction command value through the closed-loop control that has been multiplied by the first coefficient (=0.67), the shape correction command value through the open-loop control that has been multiplied by the second coefficient (=0), and the upper and lower limits of the outputs of the actuators. On the basis of these, the third coefficient is determined such that the total correction command values are all within the upper and lower limits of the outputs of the actuators. In the example of FIG. 14, the third coefficient is set to 0.67. As a result, the total correction command values are all within the range of the upper and lower limits of the output values of the actuators. The calculations in FIGS. 11 to 14 are repeated in real time during the closed-loop control.

Figure 15:
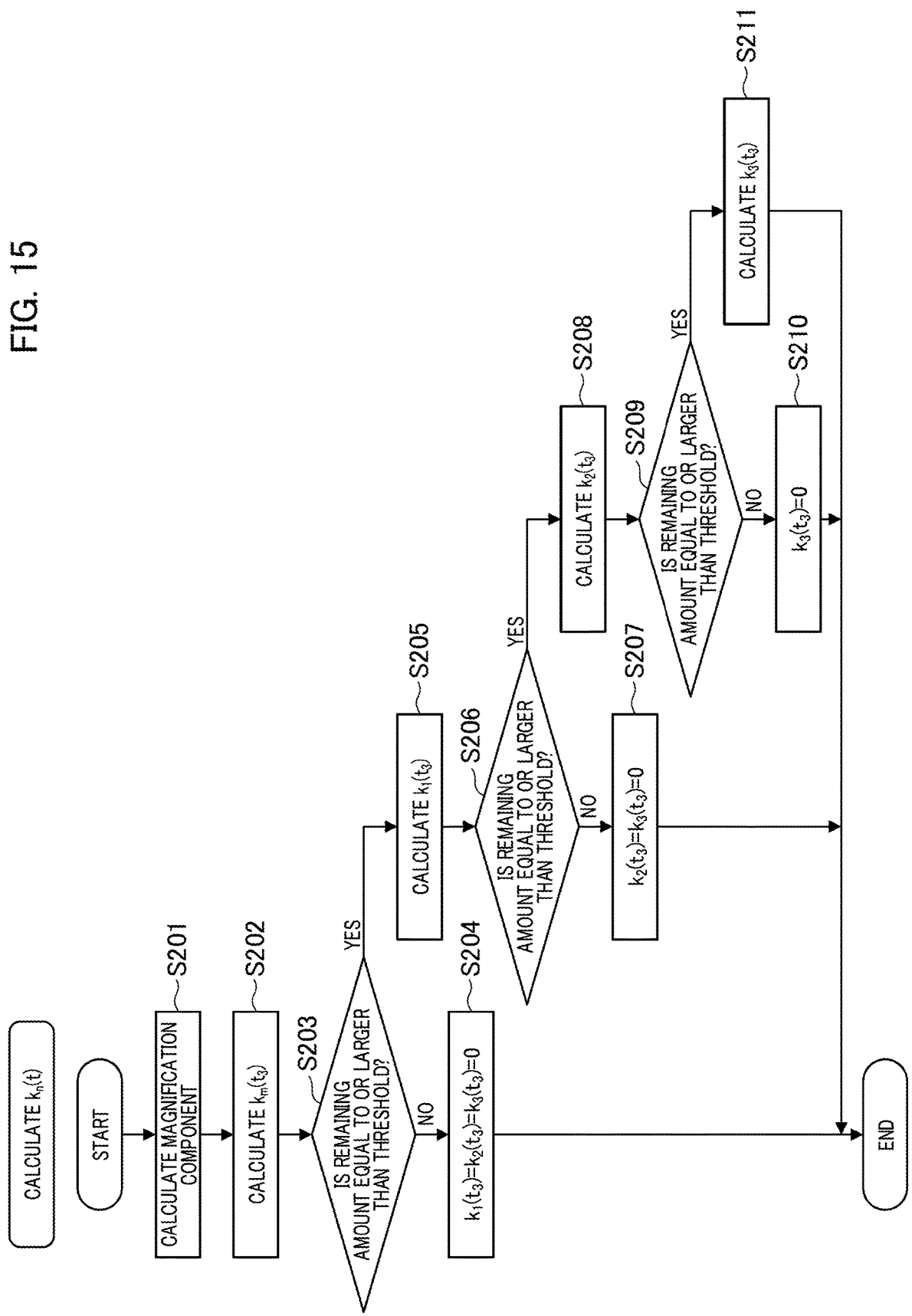
FIG. 15 is a flowchart illustrating a process of determining each coefficient.

FIG. 15 is a flowchart illustrating a process of determining each coefficient. Each operation (step) shown in this flowchart may be executed through control of each unit performed by the control unit CNT. First, the control unit CNT calculates the magnification component (S201) and determines the magnification coefficient (S202). As described above, here, the magnification coefficient is set to 1. Next, the control unit CNT determines whether or not a remaining amount of the output of the actuator up to the upper limit value and the lower limit value is equal to or larger than a threshold (S203). In other words, the control unit CNT determines whether or not a difference between the output value of the actuator that is a value obtained by multiplying the command value for the magnification correction by the magnification coefficient and the upper and lower limit values of the output of the actuator is equal to or larger than the threshold. When the remaining amount is not equal to or larger than the threshold (NO), the first coefficient, the second coefficient, and the third coefficient are each determined to be 0 (S204), and the process ends.

On the other hand, when the remaining amount of the output of the actuator up to the upper and lower limit values is equal to or larger than the threshold (S203, YES), the first coefficient is determined (S205). The first coefficient is determined on the basis of the difference between the output value of the actuator that is the value obtained by multiplying the command value for the magnification correction by the magnification coefficient and the upper and lower limit values of the output of the actuator. Next, it is determined whether or not the remaining amount of the output of the actuator up to the upper and lower limit values is equal to or more than the threshold (S206). When the remaining amount is not equal to or larger than the threshold (NO), the second coefficient and the third coefficient are each determined to be 0 (S207), and the process ends.

On the other hand, when the remaining amount of the output of the actuator up to the upper and lower limit values is equal to or larger than the threshold (S206, YES), the second coefficient is determined (S208). The second coefficient is determined on the basis of a difference between the output value of the actuator, which is obtained by adding a value obtained by multiplying the command value for the magnification correction by the magnification coefficient and a value obtained by multiplying the command value for the shape correction through the closed-loop control by the first coefficient, and the upper and lower limit values of the output of the actuator. Next, it is determined whether or not the remaining amount of the output of the actuator up to the upper and lower limit values is equal to or more than the threshold (S209). When the remaining amount is not equal to or larger than the threshold (NO), the third coefficient is set to 0 (S210), and the process is terminated.

On the other hand, when the remaining amount of the output of the actuator up to the upper and lower limit values is equal to or larger than the threshold (S209, YES), the third coefficient is determined (S211), and the process ends. For determining the third coefficient, first, the output value of the actuator is obtained by adding a value obtained by multiplying the command value for the magnification correction by the magnification coefficient, a value obtained by multiplying the command value for the shape correction through the closed-loop control by the first coefficient, and a value obtained by multiplying the command value for the shape correction through the open-loop control by the second coefficient. Then, the third coefficient is determined on the basis of a difference between the obtained output value of the actuator and the upper and lower limit values of the outputs of the actuators.

In this way, by changing the coefficients in real time, it is possible to inhibit the resultant force and the moment of the output values in the deformation mechanism MAG from being unbalanced, thereby inhibiting the shift of the mold M from the mold chuck MC.

Second Embodiment

A second embodiment will be described. As the second embodiment, a case in which the second coefficient and the third coefficient of the first embodiment are the same will be described. In the second embodiment, as shown in FIG. 10, each magnification and shape correction amount is divided into the magnification to be corrected through the closed-loop control, the shape to be corrected through the closed-loop control, the shape to be corrected through the open-loop control, and the shape to be corrected through the open-loop control in conjunction with a heating deformation of the substrate. Then, the magnification coefficient, the first coefficient, the second coefficient, and the third coefficient are respectively changed from 0 to 1 in real time such that the correction command values that are changed in real time through the closed-loop control are within the upper and lower limits of the outputs of the actuators. At this time, the second coefficient and the third coefficient are the same.

In order to describe a more specific coefficient control method, a case in which the correction command values reach the upper limit values of the outputs of the actuators due to the magnification correction through the closed-loop control as in the third example shown in FIG. 6 will be described as an example.

Figure 16:
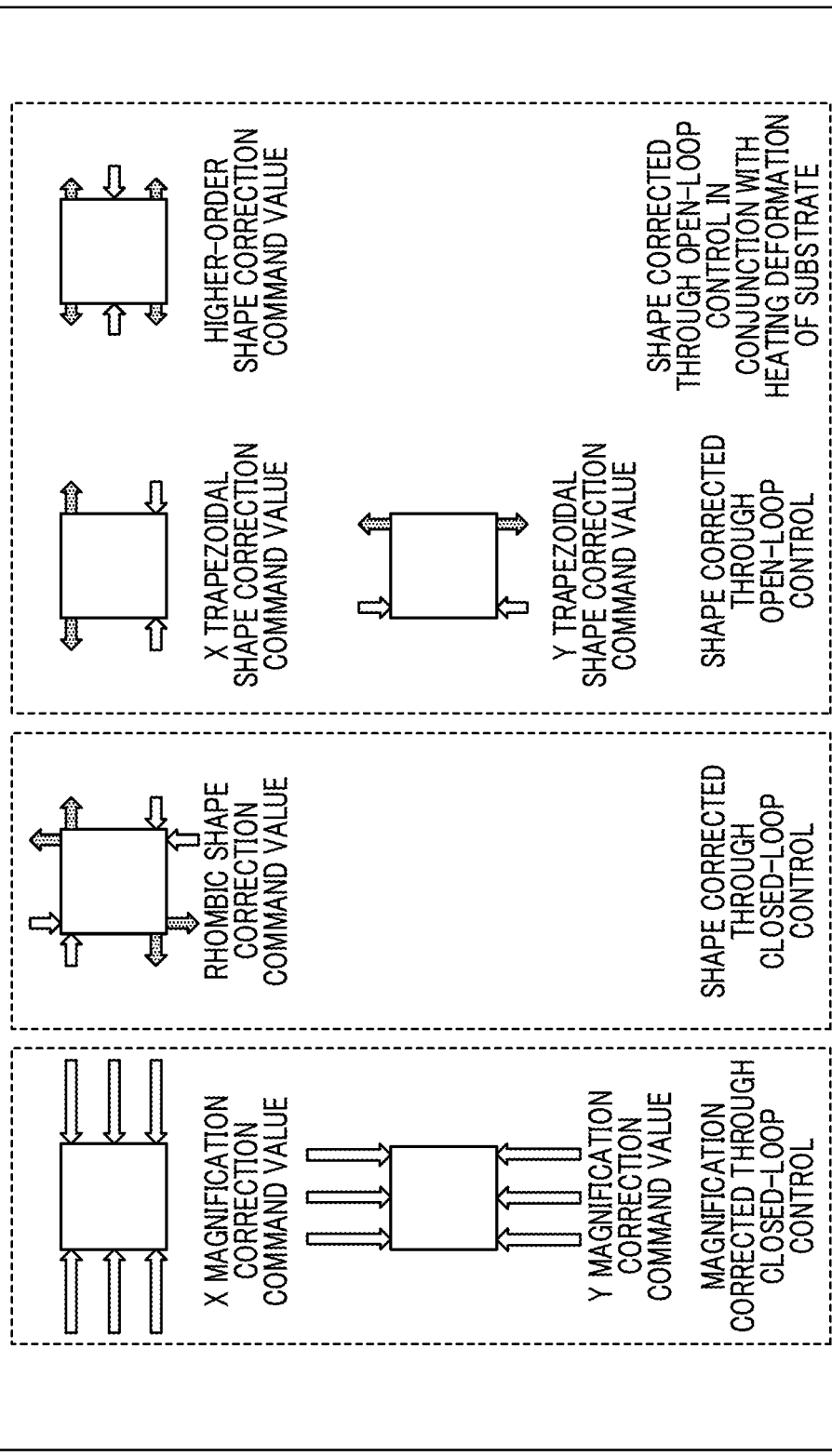
FIG. 16 is a diagram showing a state in which each correction component of the third example according to a second embodiment is separated.

FIG. 16 is a diagram showing a state in which each correction component of the third example according to the first embodiment is separated. That is, this figure shows a state in which respective correction components shown in FIG. 6 are divided into the magnification to be corrected thorough the closed-loop control, the shape to be corrected through the closed-loop control, the shape to be corrected through the open-loop control, and the shape to be corrected through the open-loop control in conjunction with the heating deformation of the substrate. However, in the second embodiment, the second coefficient and the third coefficient are the same. The magnification coefficient, the first coefficient, and the second coefficient are determined from these correction amounts, and the correction command values are set within the range of the upper and lower limits of the outputs of the actuators. Also, each of the coefficients is determined in the order of the magnification coefficient, the first coefficient, and the second coefficient.

The determination of the magnification coefficient is the same as in the first embodiment and is as shown in FIG. 12. In the present embodiment, the magnification coefficient is set to 1. The determination of the first coefficient is the same as in the first embodiment and is as shown in FIG. 13. In the present embodiment, the first coefficient is set to 0.67, and the total correction command values at this time are all within the upper and lower limits in the outputs of the actuators.

Figure 17:
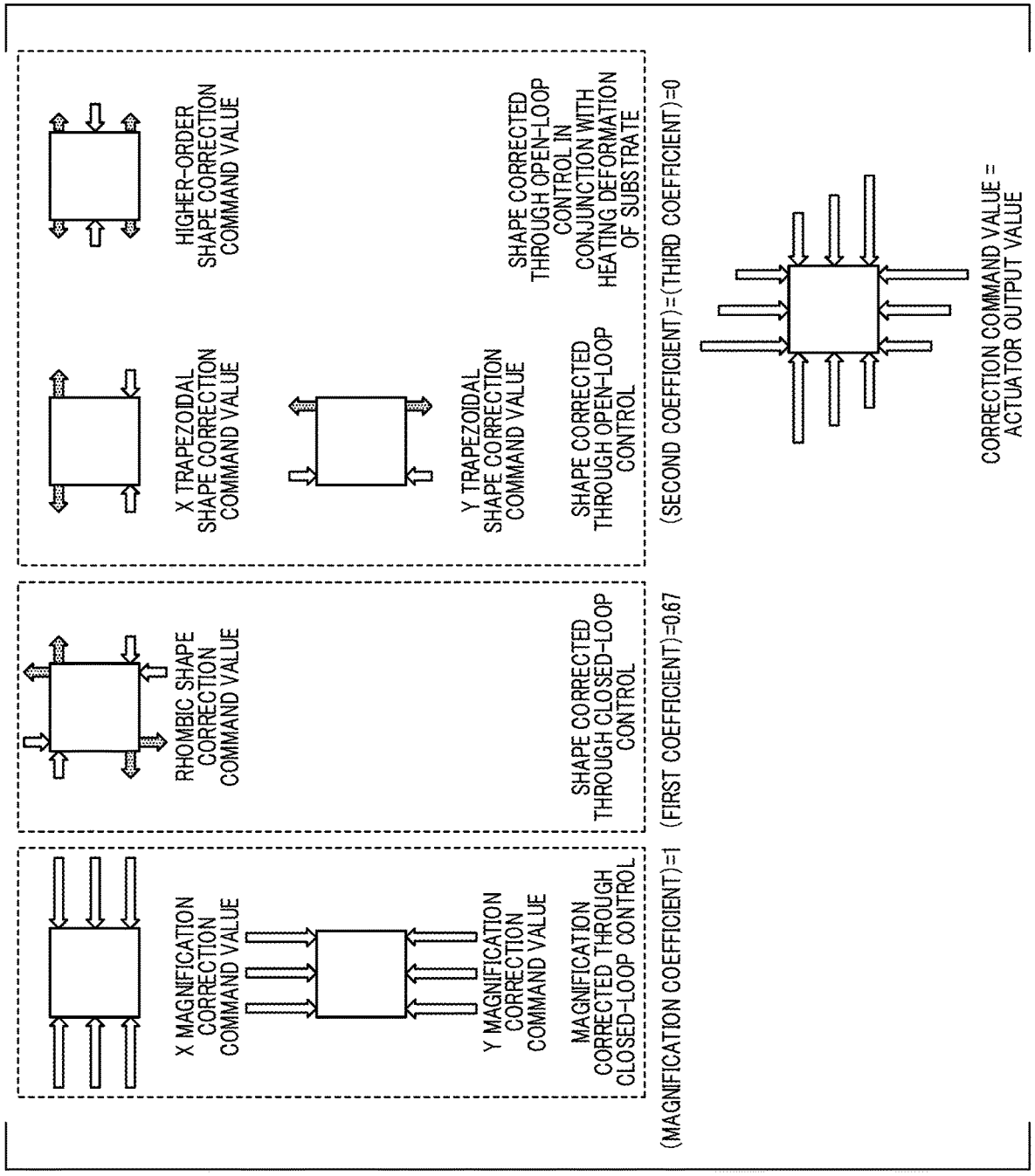
FIG. 17 is a diagram illustrating determination of the second coefficient and the third coefficient according to the second embodiment.

FIG. 17 is a diagram illustrating the determination of the second coefficient and the third coefficient according to the second embodiment. The second coefficient and the third coefficient are determined on the basis of the magnification correction command value through the closed-loop control that has been multiplied by the magnification coefficient (=1), the shape correction command value through the closed-loop control that has been multiplied by the first coefficient (=0.67), and the upper and lower limits of the outputs of the actuators. On the basis of these, the second coefficient and the third coefficient are determined such that the total correction command values are all within the upper and lower limits of the outputs of the actuators. In the example of FIG. 18, the second coefficient and the third coefficient are set to 0. As a result, the total correction command values are all within the upper and lower limits of the output values of the actuators. The calculations in the above processes are repeated in real time during the closed-loop control.

According to the present embodiment, since the second coefficient and the third coefficient are the same, the processing time can be reduced, thereby improving a throughput.

Third Embodiment

The first embodiment or the second embodiment described above does not limit the shot area. For example, in imperfect shot areas on an outer peripheral portion of the substrate, a larger amount of shape correction may be required as compared to a central shot area of the substrate due to influence of an edge of the substrate and a smaller overlay measurement area. In that case, since a possibility of mold misalignment increases, the present invention is particularly effective in the imperfect shot areas. Also, the imperfect shot areas are, for example, shot areas such as shot numbers 1, 2, 6, and 7 shown in FIG. 2.

Therefore, in the present embodiment, the determination process of each coefficient of the first embodiment or the second embodiment described above is performed only when the imprint process is performed on the imperfect shot areas.

According to the present embodiment, since the determination processes of the coefficients are performed only during the imprint process on the imperfect shot areas, the processing time can be further reduced, thereby improving the throughput.

Fourth Embodiment

In the fourth embodiment, the third coefficient determined in the first embodiment or the second embodiment is multiplied by a heating amount (a heat input amount) to a heating mechanism for heating the substrate. Thus, it is possible to inhibit deterioration in accuracy of the shape correction amounts for performing the shape correction through the closed-loop control in conjunction with the heating deformation of the substrate to the minimum.

Fifth Embodiment

In the first embodiment, the second embodiment, the third embodiment, and the fourth embodiment described above, a first object is to reduce occurrence of a mold shift in which the mold M shifts from the mold chuck MC. For this reason, when the magnification coefficient, the first coefficient, the second coefficient, and the third coefficient are other than 1, there is also a problem that the applied correction amounts do not reach the correction amounts to be originally applied. On the other hand, even in the case in which the balance of the resultant force and the moment is lost, when the resultant force and the moment are not more than a frictional force between a back surface of the mold M and the mold chuck MC, it is possible to reduce the shift of the mold M from the mold chuck MC.

Therefore, in the fifth embodiment, for example, the resultant force and the moment are intentionally generated by the deformation mechanism MAG in advance while the mold M is sucked to the mold chuck MC. Thus, the frictional force between the back surface of the mold M and the mold chuck MC is measured by detecting the mold shift.

When the magnification coefficient, the first coefficient, the second coefficient, and the third coefficient are calculated, a method of allowing the resultant force and the moment to be equal to or less than the frictional force to relax restrictions on the correction amounts may be considered.

(Embodiment of Method of Manufacturing Article)

The pattern of the cured product formed by using the imprint apparatus is used for at least a part of various articles permanently or temporarily when various articles are manufactured. The articles include an electric circuit element, an optical element, a MEMS, a recording element, a sensor, a mold, or the like. Examples of the electric circuit element include a volatile or non-volatile semiconductor memory such as a dynamic random-access memory (DRAM), a static random-access memory (SRAM), a flash memory, and a magnetoresistive random-access memory (MRAM), a semiconductor element such as a large scale integration (LSI), a charge-coupled device (CCD), an image sensor, and an FPGA, and the like. Examples of the mold include an imprint mold and the like.

The pattern of the cured product is used as it is as at least a part of constituent members of the articles, or is used temporarily as a resist mask. After etching or ion implantation is performed in a wafer processing step, the resist mask is removed.

Figure 18A:
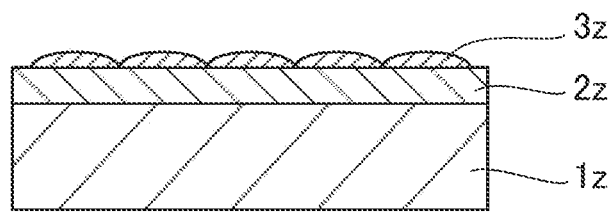
FIGS. 18A to 18F are diagrams for illustrating a method of manufacturing an article.

Next, a specific method for manufacturing an article will be described. As shown in FIG. 18A, a wafer 1z such as a silicon wafer on which a workpiece 2z such as an insulator is formed on a surface thereof is prepared, and subsequently, an imprint material 3z is applied to the surface of the workpiece 2z using an inkjet method or the like. Here, a state in which a plurality of droplet-shaped imprint materials 3z are applied to the wafer is shown.

Figure 18B:
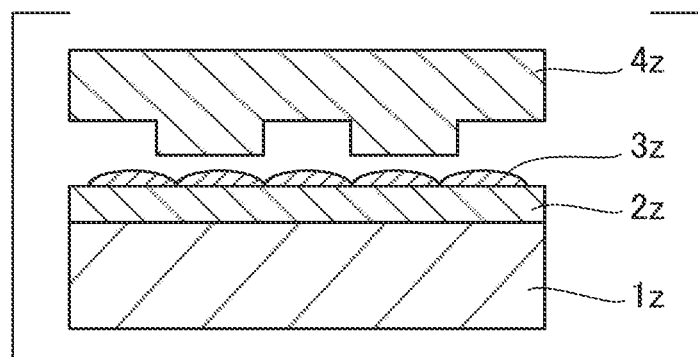
Figure 18C:
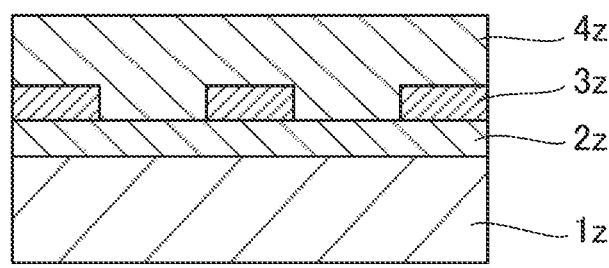

As shown in FIG. 18B, an imprint mold 4z is opposed to the imprint material 3z on the wafer such that a side on which an uneven pattern thereof is formed faces the imprint material 3z. As shown in FIG. 18C, the wafer 1z to which the imprint material 3z is applied is brought into contact with the mold 4z, and pressure is applied thereto. The imprint material 3z is filled in a gap between the mold 4z and the workpiece 2z. In this state, when light serving as curing energy is radiated through the mold 4z, the imprint material 3z is cured.

Figure 18D:
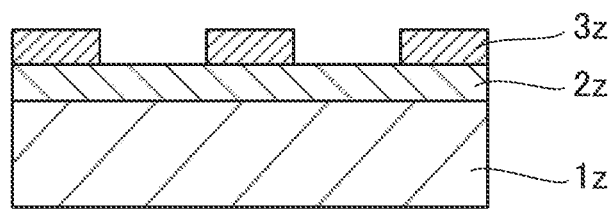

As shown in FIG. 18D, when the mold 4z and the wafer 1z are separated from each other after the imprint material 3z is cured, a pattern of a cured product of the imprint material 3z is formed on the wafer 1z. This pattern of the cured product is formed in a shape in which concave portions of the mold correspond to convex portions of the cured product and convex portions of the mold correspond to concave portions of the cured product. That is, the uneven pattern of the mold 4z is transferred to the imprint material 3z.

Figure 18E:
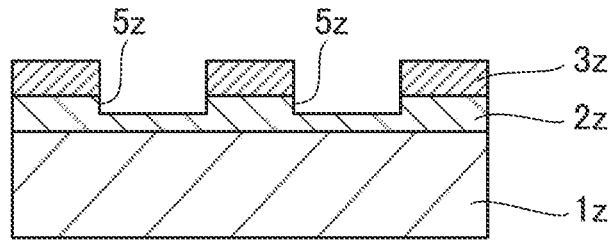
Figure 18F:
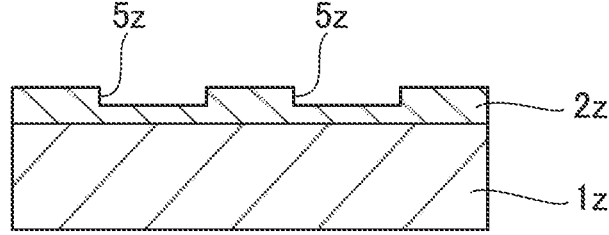

As shown in FIG. 18E, when etching is performed using the pattern of the cured product as an etching-resistant mask, portions of the surface of the workpiece 2z in which the cured product does not remain or remains thinly are removed to form grooves 5z. As shown in FIG. 18F, when the pattern of the cured product is removed, the article in which the grooves 5z are formed on the surface of the workpiece 2z can be obtained. Here, although the pattern of the cured product is removed, it may be used, for example, as a film for interlayer insulation included in a semiconductor element or the like, that is, a constituent member of the article, without removing it after processing.

Other Embodiments

Embodiment(s) of the present invention can also be realized by a computer of a system or device that reads out and execute computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or device by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-99739, filed May 28, 2019, which is hereby incorporated by reference wherein in its entirety.

What is claimed is:

1. An imprint apparatus which forms a pattern of an imprint material on a substrate using a mold, comprising:
   a correction mechanism configured to apply a force to the mold to deform the pattern formed in the mold; and
   a control unit configured to control the correction mechanism using a correction command value determined on the basis of differences in shape between a pattern area of the mold and a shot area of the substrate, wherein the differences in shape are divided so as to include a magnification component, a first correction component corrected by closed-loop control of the correction mechanism, and a second correction component corrected by open-loop control of the correction mechanism,
   wherein the correction command value includes a value obtained by summing a value which is obtained by multiplying a magnification correction command value given to the correction mechanism in order to correct the magnification component by a magnification coefficient, a first value which is obtained by multiplying a first correction command value for correcting the first correction component by a first coefficient, and a second value which is obtained by multiplying a second correction command value for correcting the second correction component by a second coefficient, and
   wherein the control unit is configured to determine the magnification coefficient, the first coefficient, and the second coefficient in this order so that the correction command value falls within a range that is correctable by the correction mechanism.

2. The imprint apparatus according to claim 1, wherein the first correction component includes either one of a rhombic shape and a trapezoidal shape.

3. The imprint apparatus according to claim 1, wherein the second correction component includes either one of a rhombic shape and a trapezoidal shape, and is different from the first shape.

4. An imprint apparatus which forms a pattern of an imprint material on a substrate using a mold, comprising:
   a correction mechanism configured to apply a force to the mold to deform the pattern formed in the mold;
   a heating mechanism configured to heat and deform the substrate; and
   a control unit configured to control the correction mechanism using a correction command value determined on the basis of differences in shape between a pattern area of the mold and a shot area of the substrate, wherein the differences in shape are divided so as to include a magnification component, a first correction component corrected by closed-loop control of the correction mechanism, a second correction component corrected by open-loop control of the correction mechanism, and a third correction component corrected by open-loop control of the correction mechanism and heat deformation control to the substrate by the heating mechanism,
   wherein the correction command value includes a value obtained by summing a value which is obtained by multiplying a magnification correction command value given to the correction mechanism in order to correct the magnification component by a magnification coefficient, a first value which is obtained by multiplying a first correction command value for correcting the first correction component by a first coefficient, a second value which is obtained by multiplying a second correction command value for correcting the second correction component by a second coefficient, and a third value which is obtained by multiplying a third correction command value for correcting the third correction component by a third coefficient, and
   wherein the control unit is configured to determine the magnification coefficient, the first coefficient, the second coefficient, and the third coefficient in this order so that the correction command value falls within a range that is correctable by the correction mechanism.

5. The imprint apparatus according to claim 4, wherein the control unit is configured to set the second coefficient and the third coefficient to the same value.

6. The imprint apparatus according to claim 4, wherein the control unit is configured to multiply the third coefficient by a heating amount of the heating mechanism.

7. The imprint apparatus according to claim 4, wherein the third correction component includes at least one of a rhombic shape, a trapezoidal shape, and a higher-order shape having sides represented by higher order functions than the rhombic shape and the trapezoidal shape.

8. The imprint apparatus according to claim 1, wherein the control unit is configured to change the shape coefficient between 0 and 1.

9. The imprint apparatus according to claim 1, wherein the control unit is configured to set the magnification coefficient to 1.

10. An imprint method of forming a pattern of an imprint material on a substrate using a mold, the method comprising:

controlling a correction mechanism that applies a force to the mold to deform the pattern formed in the mold using a correction command value determined on the basis of differences in shape between a pattern area of the mold and a shot area of the substrate, the differences in shape being divided to include a magnification component, a first correction component corrected by closed-loop control of the correction mechanism, and a second correction component corrected by open-loop control of the correction mechanism, the correction command value including a value obtained by summing a value which is obtained by multiplying a magnification correction command value given to the correction mechanism in order to correct the magnification component by a magnification coefficient, a first value which is obtained by multiplying a first correction command value for correcting the first correction component by a first coefficient, and a second value which is obtained by multiplying a second correction command value for correcting the second correction component by a second coefficient; and determining the magnification coefficient, the first coefficient, and the second coefficient in this order so that the correction command value falls within a range that is correctable by the correction mechanism.

11. A method of manufacturing an article using an imprint apparatus which forms a pattern of an imprint material on a substrate using a mold, the method comprising:

forming the pattern on the substrate using the imprint apparatus;

processing the substrate on which the pattern is formed; and manufacturing the article from the processed substrate, wherein the imprint apparatus includes a correction mechanism configured to apply a force to the mold to deform the pattern formed in the mold, and a control unit configured to control the correction mechanism using a correction command value determined on the basis of differences in shape between a pattern area of the mold and a shot area of the substrate, wherein the differences in shape are divided so as to include a magnification component, a first correction component corrected by closed-loop control of the correction mechanism, and a second correction component corrected by open-loop control of the correction mechanism, wherein the correction command value includes a value obtained by summing a value which is obtained by multiplying a magnification correction command value given to the correction mechanism in order to correct the magnification component by a magnification coefficient, a first value which is obtained by multiplying a first correction command value for correcting the first correction component by a first coefficient, and a second value which is obtained by multiplying a second correction command value for correcting the second correction component by a second coefficient, and wherein the control unit is configured to determine the magnification coefficient, the first coefficient, and the second coefficient in this order so that the correction command value falls within a range that is correctable by the correction mechanism.

12. The imprint apparatus according to claim 1, wherein the control unit is configured to repeatedly perform control for determining the magnification coefficient and the shape coefficient while applying the force to the mold by the correction mechanism.

13. The imprint apparatus according to claim 1, wherein the correction mechanism comprises a plurality of contact portions which deform the pattern of the mold by applying a force to a side surface of the mold.

14. The imprint apparatus according to claim 1, further including an acquisition mechanism configured to acquire the differences in shape between the pattern area of the mold and the shot area of the substrate on the basis of a relative position between a mark of the mold and a mark of the substrate.

15. The imprint apparatus according to claim 1, wherein the control unit is configured to determine that the first coefficient and the second coefficient are zero when the correction output value of the correction mechanism determined by the determined magnification coefficient exceeds a threshold value, and wherein the control unit is configured to determine that the second coefficient is zero when the determined correction output value of the correction mechanism determined by the determined magnification factor and the first coefficient exceeds the threshold value.

* * * * *